United States Patent
Ooishi

(10) Patent No.: US 6,535,433 B2
(45) Date of Patent: Mar. 18, 2003

(54) SEMICONDUCTOR LOGIC CIRCUIT DEVICE OF LOW CURRENT CONSUMPTION

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/206,879

(22) Filed: Jul. 29, 2002

(65) Prior Publication Data

US 2002/0186040 A1 Dec. 12, 2002

Related U.S. Application Data

(63) Continuation of application No. 09/356,351, filed on Jul. 19, 1999, now Pat. No. 6,433,586.

(30) Foreign Application Priority Data

Feb. 22, 1999 (JP) ............................................ 11-043093

(51) Int. Cl.[7] .............................................. H03K 3/289
(52) U.S. Cl. ................... 365/189.05; 365/226; 327/203
(58) Field of Search ........................ 365/189.05, 189.11, 365/230.08, 226, 233; 327/57, 202, 203

(56) References Cited

U.S. PATENT DOCUMENTS

| 4,063,225 | A |   | 12/1977 | Stewart ...................... 365/156 |
| 4,521,702 | A |   | 6/1985  | Kleinberg .................... 327/557 |
| 4,716,312 | A |   | 12/1987 | Mead et al. .................. 326/97  |
| 5,162,667 | A |   | 11/1992 | Yasui et al. .................. 326/113 |
| 5,162,681 | A | * | 11/1992 | Lee ........................ 365/189.11 |
| 5,302,866 | A |   | 4/1994  | Chiang et al. ................ 326/113 |
| 5,907,127 | A |   | 5/1999  | Pearson et al. ............... 326/113 |
| 6,069,495 | A |   | 5/2000  | Ciccone et al. ............... 326/113 |
| 6,194,914 | B1|   | 2/2001  | Sako ......................... 326/113 |
| 6,333,662 | B1| * | 12/2001 | Umezawa et al. ..... 365/189.11 |
| 6,363,011 | B1| * | 3/2002  | Hirose et al. .......... 365/189.05 |

FOREIGN PATENT DOCUMENTS

JP        8-7571        1/1996

OTHER PUBLICATIONS

"1–V Power Supply High–Speed Digital Circuit Technology with Multithreshold–Voltage CMOS", S. Mutoh et al., IEEE Journal of Solid–State Circuits, vol. 30, No. 8, Aug. 1995, pp. 847–854.

* cited by examiner

*Primary Examiner*—Trong Phan
(74) *Attorney, Agent, or Firm*—McDermott, Will & Emery

(57) ABSTRACT

A logical processing part is formed by a pass transistor logic element, and an output signal of the pass transistor logic element is applied to the gates of MOS transistors for differentially amplifying and latching the output signal in the latch stage. This latch stage is formed by master and slave latch circuits, and power supply to the master latch circuit is cut off while holding an information signal only in the slave latch circuit with the level of a power supply voltage thereto increased, reducing a leakage current in a sleep mode or a power down mode. A logic circuit correctly operating at a high speed with low current consumption under a low power supply voltage is provided.

9 Claims, 19 Drawing Sheets

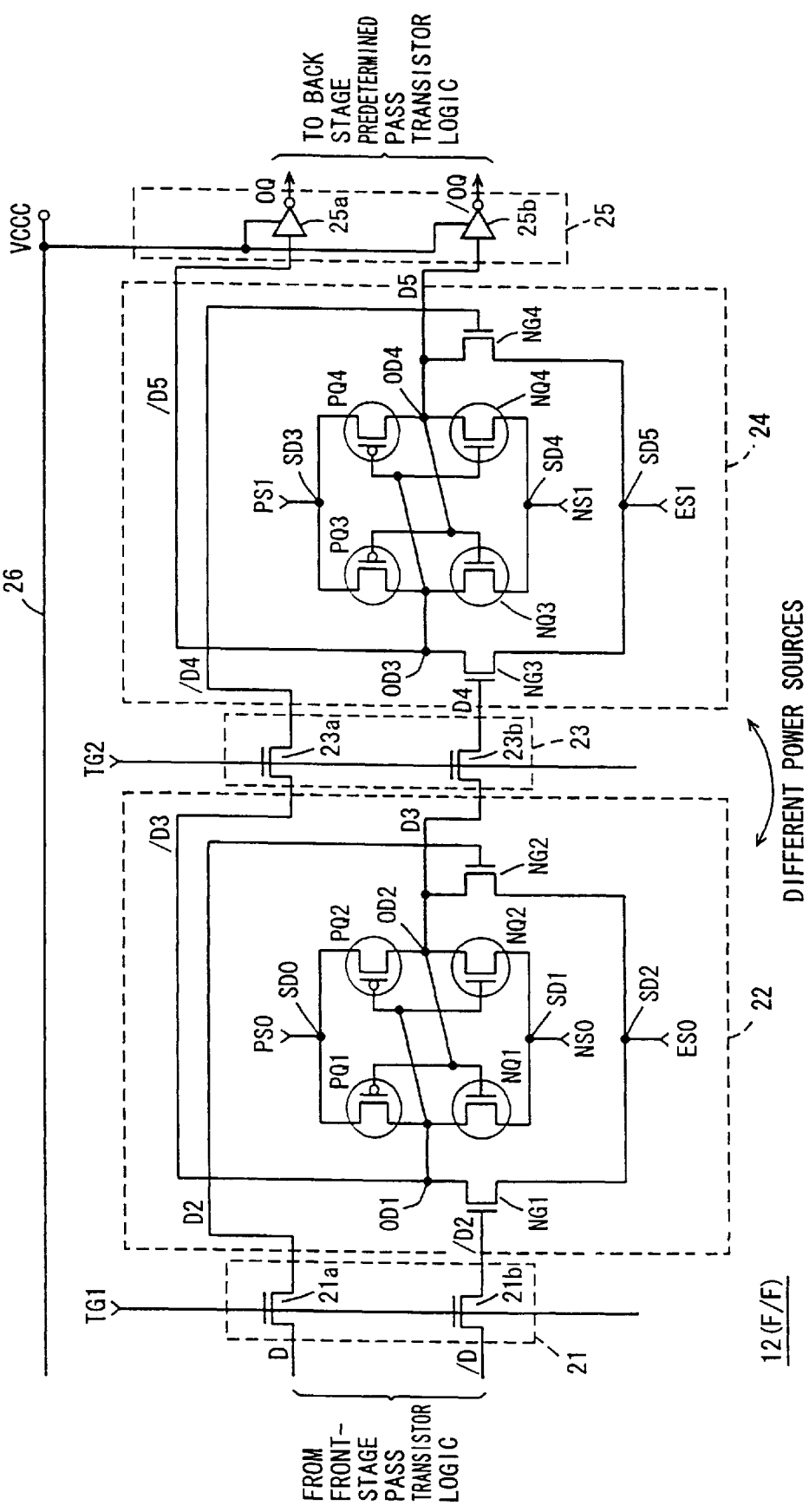
F I G. 4

MASTER LATCH
EQUALIZE END POINT

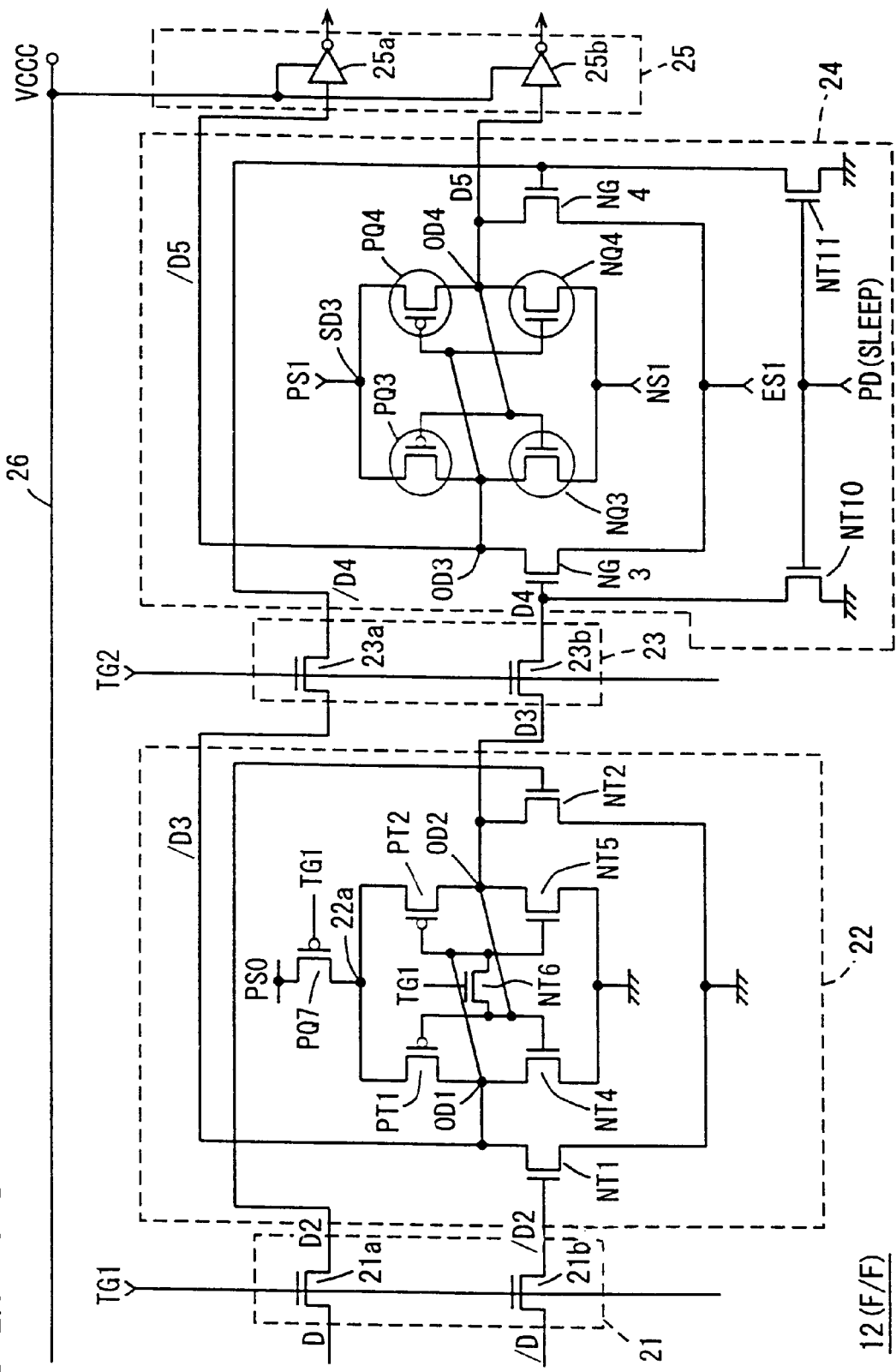
F I G. 1 6

000# SEMICONDUCTOR LOGIC CIRCUIT DEVICE OF LOW CURRENT CONSUMPTION

RELATED APPLICATION

This application is a continuation of U.S. patent application Ser. No. 09/356,351, filed Jul. 19, 1999, now U.S. Pat. No. 6,433,586.

BACKGROUND OF THE INVENTION

1. Field of the Invention

The present invention relates to a semiconductor circuit device, and more particularly, it relates to a logic circuit device logically processing an input signal. More specifically, the present invention relates to a semiconductor logic circuit device correctly operating at a high speed under a low power supply voltage.

2. Description of the Background Art

In a recent large scale integrated circuit, a MOS transistor (insulated gate field effect transistor) of a component thereof is reduced in size. In order to guarantee breakdown voltage of the miniaturized MOS transistor, an operating power supply voltage is lowered. Further, the quantity of a charge/discharge current on a signal line is reduced due to the lowering of the operating power supply voltage, thereby reducing current consumption. In addition, the amplitude of an internal signal is also reduced, whereby the signal can be transmitted at a high speed to implement a high-speed operation.

When the operating power supply voltage is lowered, the MOS transistor is reduced in size and a gate insulator film is correspondingly reduced in thickness. The MOS transistor is generally reduced in size in accordance with a rule called a scaling rule. As regards a threshold voltage of the MOS transistor, however, the absolute value thereof cannot be reduced in accordance with the scaling rule together with reduction of the operating power supply voltage. The threshold voltage is a gate-to-source voltage feeding a predetermined drain current with the channel width predetermined. Even if the gate-to-source voltage Vgs is 0 V, a subthreshold current flows. This subthreshold current increases as the absolute value of the threshold voltage decreases. When the absolute value of the threshold voltage of the MOS transistor is decreased in proportion to the reduction of the power supply voltage, therefore, the subthreshold current increases to disadvantageously increase current consumption in a standby state.

In order to solve such a problem of the subthreshold leakage current, a leakage current prevention circuit called a hierarchical power supply, for example, has been proposed.

FIG. 26 illustrates the structure of a conventional semiconductor device having a hierarchical power supply structure. Referring to FIG. 26, the conventional semiconductor device includes a main power supply line 1000 transmitting a power supply voltage VCC, a main ground line 1002 transmitting a ground voltage GND, a sub power supply line 1004 coupled to the main power supply line 1000 through a switching transistor 1003, and a sub ground line 1006 coupled to the main ground line 1002 through a switching transistor 1005. The switching transistor 1003 is rendered conductive when an active cycle defining signal ZACT is active (low level), while the switching transistor 1005 is rendered conductive when an active cycle defining signal ACT is at a high level of an active state.

The semiconductor device further includes two stages of cascaded inverters 1010 and 1012 as logic circuits. Each of the inverters 1010 and 1012, which are identical in structure to each other, includes a p-channel MOS transistor PTa and an n-channel MOS transistor NTa. An input signal IN for the inverter 1010 is set low in a standby cycle (both active cycle defining signals ZACT and ACT are inactive). In the inverter 1010, the source of the p-channel MOS transistor PTa is coupled to the main power supply line 1000 while the source of the n-channel MOS transistor NTa is coupled to the sub ground line 1006. The inverter 1012 receives the voltages on the sub power supply line 1004 and the main ground line 1002 as operating power supply voltages. In such an active cycle that the input signal IN changes, the active cycle defining signals ZACT and ACT are active, the switching transistors 1003 and 1005 are rendered conductive, the sub power supply line 1004 is coupled to the main power, supply line 1000, and the sub ground line 1006 is coupled to the main ground line 1002. Therefore, the voltage on the sub power supply line 1004 reaches the level of the power supply voltage VCC, and the voltage on the sub ground line 1006 reaches the level of the ground voltage GND. When the absolute values of the threshold voltages of MOS transistors PTa and NTa are decreased, the inverters 1010 and 1012 operate at a high speed to output output signals in response to the input signal IN.

In the standby cycle, the input signal IN is fixed at a low level and the output signal of the inverter 1010 is fixed at a high level. In this standby cycle, the active cycle defining signals ZACT and ACT are inactivated and hence the switching transistors 1003 and 1005 are rendered non-conductive. In the inverter 1010, the p-channel MOS transistor PTa is rendered conductive and the voltages of both the source and the drain thereof reach the level of the power supply voltage VCC. In the p-channel MOS transistor PTa, therefore, the source and drain voltages thereof reach the same voltage level to cause no leakage current. In the n-channel MOS transistor NTa of the inverter 1010, on the other hand, the gate voltage thereof is set low by the input signal IN to cause a subthreshold leakage current. At this time, the voltage level of the sub ground line 1006 rises beyond the ground voltage GND due to the leakage current. The gate-to-source voltage of the n-channel MOS transistor NTa of the inverter 1010 is set in a reverse bias state (the source voltage is higher than the gate voltage), to suppress the subthreshold leakage current.

In the inverter 1012, on the other hand, an input signal thereto is at a high level. Therefore, the p-channel MOS transistor in the inverter 1012 is rendered non-conductive to be likely to cause a leakage current (subthreshold current). However, the voltage on the sub power supply line 1004 drops below the power supply voltage VCC due to the leakage current. Also in the inverter 1012, therefore, the gate-to-source voltage of the p-channel MOS transistor is set in a reverse bias state to reduce the subthreshold current.

In the hierarchical power supply structure shown in FIG. 26, the connection manner of its power supply nodes is determined depending on the voltage level of the input signal or the output signal in the standby cycle. In this hierarchical power supply structure, therefore, connection of the power supply nodes of logic gates (inverters) can be determined if the logical level of the input signal or the output signal in the standby cycle can be predetermined. If the logical level of the input signal or the output signal in the standby cycle cannot be predicted as in random logic or the like, however, the connection path for the power supply nodes cannot be determined.

FIG. 27 illustrates an exemplary conventional random logic device. Referring to FIG. 27, this random logic device includes a drive circuit 1020 buffering input signals, a transfer circuit 1022 latching and transferring output signals of the drive circuit 1020 in synchronization with a clock signal, a logic circuit 1024 performing prescribed logical processing on output signals of the transfer circuit 1022, a transfer circuit 1026 latching and transferring output signals of the logic circuit 1024 in synchronization with the clock signal, a logic circuit 1028 performing prescribed logical processing on output signals of the transfer circuit 1026, and a transfer circuit 1030 transferring output signals of the logic circuit 1028 in synchronization with the clock signal.

The drive circuit 1020 includes drivers DR provided in correspondence to the input signals, respectively. The transfer circuit 1022 includes flip-flops F/F provided in correspondence to the drivers DR of the drive circuit 1020 respectively. The logic circuit 1024 includes logic elements GL1 to GL3 . . . . Output signals from the flip-flops F/F of the transfer circuit 1023 are transferred to the logic elements GL1 to GL3 . . . of the logic circuit 1024 respectively. Connection paths between the flip-flops F/F and the logic elements GL1 to GL3 are determined in accordance with the logical processing performed in practice.

The transfer circuits 1026 includes flip-flops F/F provided in correspondence to the logic elements GL1 to GL3 . . . of the logic circuit 1024 respectively. Two flip-flops F/F are provided for transferring complementary signals with respect to each logic element GL1 (i=1 to 3 . . . ).

The logic circuit 1028 includes logic elements GL4 to GL6 . . . performing logical process in parallel. The logic elements GL4 to GL6 . . . receive prescribed output signals from the flip-flops F/F of the transfer circuit 1026.

The transfer circuit 1030 includes flip-flops F/F provided in correspondence to the logic elements GL4 to GL6 . . . . Also in the transfer circuit 1030, two flip-flops F/F are provided for each logic element GLj (j=4 to 6 . . . ) of the logic circuit 1028, to transfer complementary signals.

The random logic device shown in FIG. 27 is such a synchronous logic device that the logic circuits 1020 and 1028 statically perform logical processing respectively and the transfer circuits 1022 and 1026 transfer signals in synchronization with the clock signal. The logical levels of the output signals of the logic circuits 1024 and 1028 vary with the signals inputted from the drive circuit 1020. In particular, the voltage levels (logical levels) of the signals latched in the transfer circuits 1022, 1026 and 1030 vary with the output signals from the corresponding logic elements, and hence the hierarchical power supply structure shown in FIG. 26 cannot be applied to the transfer circuits 1022, 1026 and 1030. This also applies to the logic circuits 1024 and 1028.

FIG. 28 illustrates an exemplary structure of each flip-flop F/F shown in FIG. 27. Referring to FIG. 28, the flip-flop F/F includes a clocked inverter 1032 activated, when a clock signal CKB is at a high level, to invert and output the input signal, an inverter 1034 inverting the output signal of the docked inverter 1032, a clocked inverter 1036 activated, when a clock signal CK is at a high level, for inverting an output signal of the inverter 1034 and transmitting the inverted signal to an input of the inverter 1034, a transmission gate 1038 transmitting the output signal of the inverter 1034 in accordance with clock signal CK, an inverter 1040 inverting the output signal of the transmission gate 1038, a clocked inverter 1042, activated when the clock signal CKB is at a high level, for inverting an output signal of the inverter 1040 and transmitting the inverted signal to an input of the inverter 1040, and an inverter 1044

The clok signals CK and CKB are complementary c clok signals. When the clock signal CK is at a high level, the c cloked inverters 1032 and 1042 are set in an output high impedance state, while the transmission gate 1038 is rendered conductive. Further, the c cloked inverter 1036 operates as an inverter. In this state, therefore, the inverters 1034 and 1036 latch the signal, which in turn is transmitted to the inverter 1040 through the transmission gate 1038. The output signal of the inverter 1040 is outputted through the inverter 1044.

When the c clok signal CK goes low, the c cloked inverter 1036 enters an output high impedance state, the cloked inverters 1032 and 1042 operate as inverters, and the transmission gate 1038 is rendered non-conductive. Therefore, the inverters 1040 and 1042 form a latch circuit, to latch and output the signal supplied in the high-level state of the clock signal CK. On the other hand, the clocked inverter 1032 inverts the input signal and supplies the inverted signal to the inverter 1034. The transmission gate 1038 is non-conductive and hence the output signal of the inverter 1034 simply changes in response to the input signal.

The flip-flop F/F shown in FIG. 28 takes and transfers the supplied signal in accordance with the two-phase clock signals CK and CKB. When the definite timings for the output signals of the logic circuits 1020 and 1028 shown in FIG. 27 are different from each other, therefore, the signals can be sequentially transferred in accordance with the clock signals CK and CKB for performing logical processing in synchronization with the clock signals.

As shown in FIG. 28, however, the logical level of the output signal from each inverter of the flip-flop F/F varies with the input signal, and cannot be predicted. Therefore, the hierarchical power supply structure shown in FIG. 26 cannot be applied for reducing current consumption in the flip-flop F/F in the standby cycle.

Not only in the standby cycle in a normal operating mode but also in a sleep mode set when no logical processing is performed over a long period, a similar problem arises to prevent reduction of current consumption.

In order to reduce current consumption in the standby cycle and in the sleep mode or a power down mode in the aforementioned random logic device, there has been also proposed a method of separately providing a nonvolatile memory circuit called a balloon circuit for saving information to be held and cutting off the power supply for a main circuit in the standby cycle or the sleep mode (refer to IEEE JSSC Vol. 30, No. 8, 1995).

This structure cuts off the power supply and hence no path is present for feeding a current. Thus, current consumption in the logic elements and the flip-flops can be eliminated.

However, the balloon circuit must be provided independently of signal paths performing general logical processing for saving the information through another signal path, and hence the occupying area increases and control for saving the information is complicated.

Such a random logic device is not restricted to a general logical processing circuit. When an equipment called PDA (personal digital assistants: portable information terminal equipment), for example, is not used over a long period, its internal circuit is set in a sleep mode to prepare for next processing. In such a portable equipment driven by a battery, the current dissipation must be minimized in the sleep mode.

SUMMARY OF THE INVENTION

An object of the present invention is to provide a semiconductor circuit device capable of reducing current consumption under a low power supply voltage without deteriorating high-speed operability.

The semiconductor circuit device according to the present invention includes a pass transistor logic element formed by a pass transistor passing a supplied signal for performing prescribed logical processing on an input signal for outputting and a first latch circuit having an amplifier stage receiving the output signal of the pass transistor logic element with a high input impedance for amplification and a latch stage coupled with the amplifier stage for latching an output signal thereof.

A circuit part performing actual logical processing is formed by the pass transistors, and the pass transistor logic simply transmits the signal to consume no power supply voltage. Thus, the logic element can be implemented with a MOS transistor having a low threshold voltage so that the logic part can be driven at a high speed with low current consumption.

The tile output signal of the pass transistor logic element is supplied to the latch circuit having a high input impedance, whereby no leakage current flows from the pass transistor logic element to a power supply node, and low current consumption is implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 illustrates the structure of a flip-flop according to an embodiment 1 of the present invention;

FIG. 16 illustrates the structure of a flip-flop according to an embodiment 5 of the present invention;

DESCRIPTION OF THE PREFERRED EMBODIMENTS

Overall Structure

Figure 1:
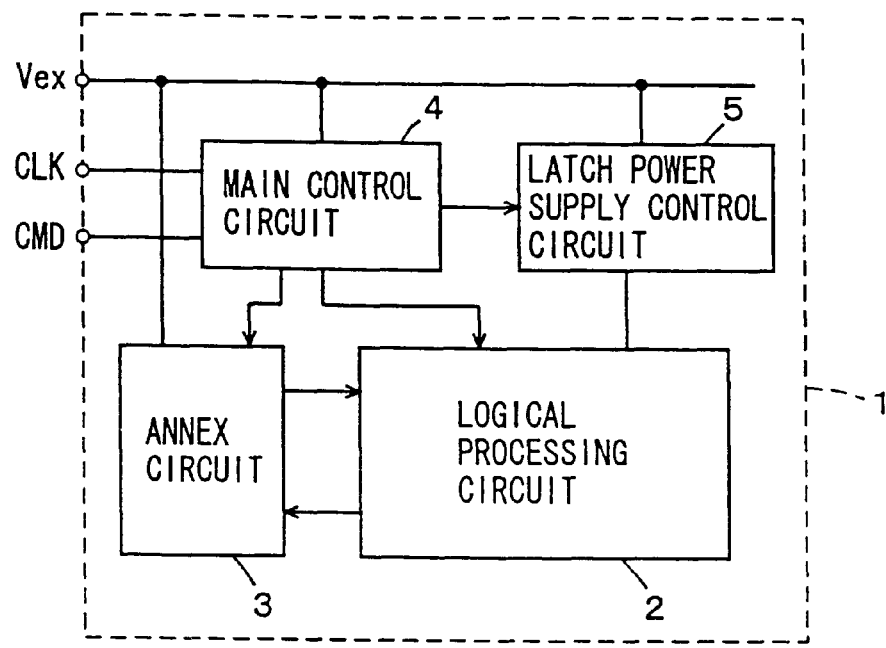
FIG. 1 schematically illustrates the overall structure of a semiconductor circuit device according to the present invention.

FIG. 1 schematically illustrates the overall structure of a semiconductor circuit device 1 according to the present invention. Referring to FIG. 1, the semiconductor device 1 includes a logical processing circuit 2 for performing predetermined logical processing, an annex circuit 3 transmitting/receiving a signal to/from the logical processing circuit 2, a main control circuit 4 for controlling operations of the logical processing circuit 2 and the annex circuit 3 in accordance with an external clock signal CLK and an operating mode instruction signal (command) CMD, and a latch power supply control circuit 5 for controlling a power supply voltage for flip-flops included in the logical processing circuit 2 under control of the main control circuit 4. The logical processing circuit 2 is formed by a synchronous circuit transmitting the signal in accordance with the clock signal supplied from the main control circuit 4. The latch power supply control circuit 5 adjusts the power supply voltage for the flip-flops included in the logical processing circuit 2 in accordance with the clock signal and the operating mode instruction signal from the main control circuit 4. Power supply sources for the logical processing circuit 2 and for annex circuit 3 are separately provided.

Referring to FIG. 1, the annex circuit 3 is supplied with an external power supply voltage Vex, while the logical processing circuit 2 is supplied with the power supply voltage through the latch power supply control circuit 5. The main control circuit 4 and the latch power supply control circuit 5 receive the external power supply voltage Vex to operate. Alternatively, the main control circuit 4 and the latch power supply control circuit 5 may be supplied with an internal down-converted voltage from a circuit for internally down-converting the external power supply voltage Vex as the power supply voltage.

The annex circuit 3 may be an input/output buffer simply inputting/outputting signals, a register circuit, or a storage unit of register circuitry or a memory. The contents of the logical processing to be executed by the logical processing circuit 2 are determined depending on the application of the circuit device.

Figure 2:
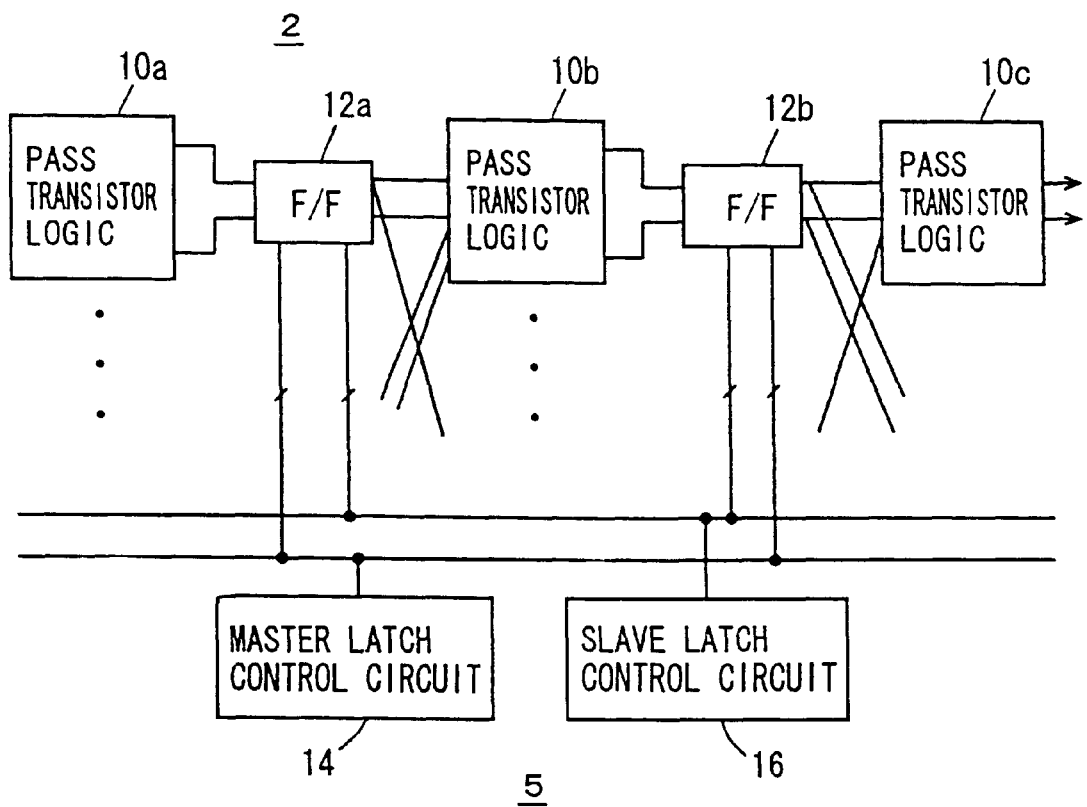
FIG. 2 schematically illustrates the structures of a latch power supply control circuit and a logical processing circuit shown in FIG. 1.

FIG. 2 illustrates an exemplary structure of the logical processing circuit 2. FIG. 2 representatively shows three stages of pass transistor logic elements 10a, 10 b and 10c and flip-flops (F/F) 12a and 12b for transmitting signals of the pass transistor logic elements in synchronization with the clock signal. Each of the pass transistor logic elements 10a to 10c, the structure of which is described in detail later, outputs complementary signals, and is provided with the flip-flop (F/F) on its output part. The pass transistor logic elements 10a to 10c receive output signals from predetermined combinations of the flip-flops in accordance with the contents of processing thereof.

The flip-flops 12a and 12b include master latches taking in output signals of the corresponding pass transistor logic elements and slave latches latching and outputting output signals of the master latches. The flip-flops 12a and 12b operate in response to output signals/voltages of a master latch control circuit 14 and a slave latch control circuit 16 included in the latch power supply control circuit 5.

Each of the pass transistor logic elements 10a to 10c implements prescribed logic with pass transistors. FIGS. 3A to 3D illustrate examples of the pass transistor logic elements.

Figure 3A:
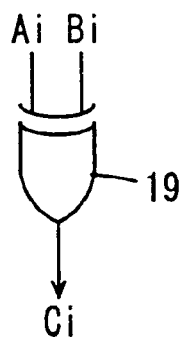
FIG. 3A illustrates an EXOR gate.
Figure 3B:
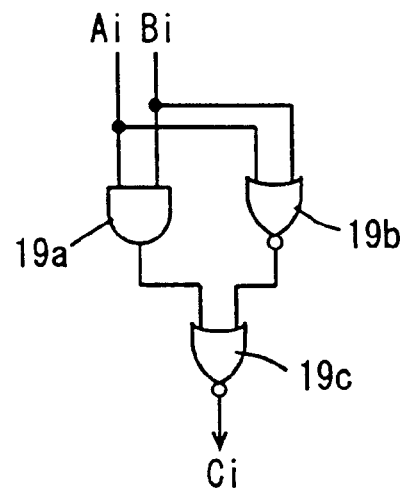
FIG. 3B illustrates an equivalent circuit of EXOR gate.

FIG. 3A illustrates a two-input EXOR gate 19. This two-input EXOR gate 19 sets its output signal Ci low when logical levels of input signals Ai and Bi match with each other. The two-input EXOR gate 19 shown in FIG. 3A is equivalent to a logic gate shown in FIG. 3B. Referring to FIG. 3B. the logic gate includes an AND gate 19a receiving the input signals Ai and Bi, a NOR gate 19b receiving the input signals Ai and Bi, and a NOR gate 19c receiving output signals of the AND gate 19a and the NOR gate 19b. When the logical levels of the input signals Ai and Bi are different from each other, the output signal of the NOR gate 19b goes low and the NOR gate 19c operates as an inverter. In this state, if the output signal of the AND gate 19a goes low, the output signal Ci goes high. When both the input signals Ai and Bi are at high or low level, on the other hand, the output signal from the AND gate 19 on the NOR gate 19b goes high and the output signal Ci of the NOR gate 19c goes low. The logic gates shown in FIG. 3B are formed by CMOS gates.

Figure 3C:
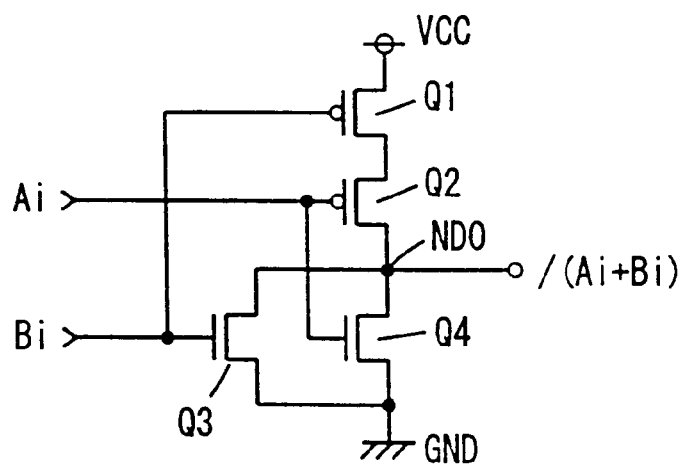
FIG. 3C illustrates the structure of a NOR gate.

FIG. 3C illustrates an exemplary structure of a two-input NOR gate. Referring to FIG. 3C, the two-input NOR gate includes p-channel MOS transistors Q1 and Q2 serially connected between a power supply node and an output node ND0, and n-channel MOS transistors Q3 and Q4 connected in parallel between the output node ND0 and a ground node. MOS transistors Q2 and Q4 receive an input signal Ai at their gates while MOS transistors Q1 and Q3 receive an input signal Bi at their gates. When at least one of the input signals Ai and Bi is at a high level, at least one of the MOS transistors Q3 and Q4 is rendered conductive and the output node ND0 is driven to the level of a ground voltage GND. When both the input signals Ai and Bi are at low level, MOS transistors Q1 and Q2 are rendered conductive while MOS transistors Q3 and Q4 are rendered non-conductive. In this state, the output node ND0 is driven to the level of a power supply voltage VCC.

As shown in FIG. 3C, the two-input NOR gate requires four MOS transistors. For forming the logic gate shown in FIG. 3B, therefore, 12 MOS transistors are required. In such a CMOS logic gate employing a p-channel MOS transistor and an n-channel MOS transistor, occurrence of a subthreshold current results from connection of CMOS transistors between the power supply node and the ground node. Further, the number of components forming the gate increases.

Figure 3D:
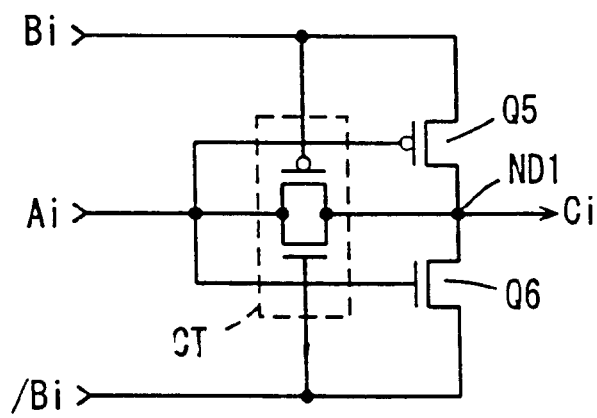
FIG. 3D illustrates the structure of an EXOR gate formed by a pass transistor.

FIG. 3D illustrates an EXOR gate formed by a pass transistor. Referring to FIG. 3D, this pass transistor logic element includes a CMOS transmission gate CT selectively passing an input signal Ai in accordance with input signals Bi and /Bi, a p-channel MOS transistor Q5 transmitting the input signal Bi to an output node ND1 when the input signal Ai is at a low level, and an n-channel MOS transistor Q6 rendered conductive when the input signal Ai is at a high level, for transmitting the input signal /Bi to the output node ND1. The input signals Bi and /Bi are complementary to each other When the input signal Bi is at a high level, CMOS transmission gate CT is non-conductive. If the input signal Ai is at a high level, the low-level input signal /Bi is transmitted to the output node ND1 through MOS transistor Q6. If the input signal Ai is at a low level, the high-level input signal Bi is transmitted through MOS transistor Q5.

When the input signal Bi is at a low level, CMOS transmission gate CT is rendered conductive to transmit the input signal Ai to the output node ND1. If the input signal Ai is at a low level, the low-level input signal Bi is transmitted to the output node ND1 through MOS transistor Q5. If the input signal Ai is at a high level, the high-level input signal /Bi is transmitted to the output node ND1 through MOS transistor Q6.

Therefore, a low-level signal is transmitted to the output node ND1 when the logical levels of the input signals Ai and Bi match with each other, while a high-level signal is outputted to the output node ND1 when the logical levels of the input signals Ai and Bi are different from each other. Thus, an output signal Ci is equal to the exclusive OR of the input signals Ai and Bi.

When a logic gate is implemented with the pass transistors as shown in FIG. 3D, the number of components thereof is remarkably reduced. Further, the logic gate employing pass transistors simply transmits an input signal and consumes no power supply voltage. Thus, the pass transistor logic elements 10a to 10c shown in FIG. 2 simply transmit input signals through the implemented logic, and consume no power supply voltage. The output signals (complementary signals) of the pass transistor logic elements 10a to 10c are supplied to correspondingly provided flip-flops (F/F) 12a and 12b. No current flows from the pass transistor logic elements 10a to 10c into the corresponding flip-flops having high input impedances, and the pass transistor logic elements 10a to 10c operate with low current consumption.

Further, no current path between a power supply node and a ground node is present in the pass transistor logic elements 10a to 10c, whereby a problem with a subthreshold current does not arises even with low-Vth transistors (MOS (insulated gate field effect) transistors having small absolute values of threshold voltages), but a logic circuit operating at a high speed can be implemented. A logic implemented by the pass transistor logic elements 10a to 10c is appropriately determined depending on the application. The main feature of the present invention resides in that a logic circuit is formed by pass transistor logic elements and output signals of the pass transistor logic elements are received with high input impedances. Embodiments of the present invention will now be described.

Embodiment 1

FIG. 4 illustrates the structure of a flip-flop (F/F) 12 included in a logical processing circuit according to an embodiment 1 of the present invention. The flip-flop (F/F) 12 shown in FIG. 4 is interposed between the pass transistor logic elements shown in FIG. 2. The front-stage pass transistor logic element outputs complementary signals D and /D. Complementary output signals OQ and /OQ from the flip-flop (F/F) 12 are supplied to an appropriate back-stage pass transistor logic element.

Referring to FIG. 4, the flip-flop (F/F) 12 includes a transfer circuit 21 passing the output signals D and /D from the front-stage pass transistor logic element in accordance with a transfer clock signal TG1, a master latch circuit 22 for amplifying and latching signals D2 and /D2 from the transfer circuit 21. a transfer circuit 23 for transferring output signals D3 and /D3 of the master latch circuit 22 in accordance with a transfer clock signal TG2, a slave latch circuit 24 for amplifying and latching signals D4 and /D4 supplied from the transfer circuit 23, and a drive circuit 25 for inverting output signals D5 and /D5 of the slave latch circuit 24, to generate the output signals OQ and /OQ for supplying to a predetermined pass transistor logic element.

The transfer circuit 21 includes transfer gates 21a and 21b rendered conductive, when the transfer clock signal TG1 is at a high level, for passing the output signals D and /D from the front-stage pass transistor logic element respectively. The transfer gates 21a and 21b are formed by n-channel MOS transistors, respectively.

The master latch circuit 22 includes an n-channel MOS transistor NG1 connected between an internal output node OD1 and an internal power supply node SD2 and receiving the signal /D2 from the transfer gate 21b at its gate, an n-channel MOS transistor NG2 connected between an internal output node OD2 and the power supply node SD2 and receiving the output signal D2 from the transfer gate 21a at its gate, and a latch circuit receiving control power supply voltages PS0 and NS0 supplied on nodes SD0 and SD1 as operating power supply voltages for operation to latch the voltages of the internal output nodes OD1 and OD2. This latch circuit includes a p-channel MOS transistor PQ1 connected between the power supply node SD0 and the internal output node OD1 with a gate thereof connected to the internal output node OD2, a p-channel MOS transistor PQ2 connected between the power supply node SD0 and the internal output node OD2 with a gate thereof connected to the internal output node OD1, an n-channel MOS transistor NQ1 connected between the internal output node OD1 and the power supply node SD1 with a gate thereof connected to the internal output node OD2, and an n-channel MOS transistor NQ2 connected between the internal output node OD2 and the power supply node SD1 with a gate thereof connected to the internal output node OD1.

MOS transistors PQ1, PQ2, NQ1 and NQ2 of low leakage currents are formed by MOS transistors of an SOI (silicon on insulator) structure or high-Vth MOS transistors large in absolute value of threshold voltage. MOS transistors NG1 and NG2 are formed by low-Vth MOS transistors.

The transfer circuit 23 includes transfer gates 23a and 23b rendered conductive, when the transfer clock signal TG2 is at a high level, for transmitting the complementary output signals /D3 and D3 of the master latch circuit 22, respectively. The transfer gates 23a and 23b are formed by n-channel MOS transistors, respectively. The transfer clock signals TG1 and TG2 are non-overlapping two-phase clock signals.

The slave latch circuit 24 includes an n-channel MOS transistor NG3 connected between an internal output node OD3 and a power supply node SD5 and receiving the signal D4 from the transfer gate 23b at its gate, an n-channel MOS transistor NG4 connected between an internal output node OD4 and the power supply node SD5 and receiving the signal /D4 from the transfer gate 23a at its gate, and a latch circuit receiving control power supply voltages PS1 and NS1 on the power supply nodes SD3 and SD4 as operating power supply voltages for operation to latch the voltages on the internal nodes OD3 and OD4. This latch circuit includes a p-channel MOS transistor PQ3 and an n-channel MOS transistor NQ3 serially connected between the power supply nodes SD3 and SD4, and a p-channel MOS transistor PQ4 and an n-channel MOS transistor NQ4 serially connected between the power supply nodes SD3 and SD4. Gates of the MOS transistors PQ3 and NQ3 are connected to the internal output node OD4, while the gates of the MOS transistors PQ4 and NQ4 are connected to the internal output node OD3. Drains of the MOS transistors PQ3 and NQ3 are connected to the internal output node OD3, while the drains of the MOS transistors PQ4 and NQ4 are connected to the internal output node OD4. Also in the slave latch circuit 24, the MOS transistors PQ3, PQ4, NQ3 and NQ4 are formed by low leakage current MOS transistors.

The drive circuit 25 includes inverters 25a and 25b receiving a power supply voltage VCCC on an internal power supply line 26 as operating power supply voltages for inverting the output signals /D5 and D5 of the slave latch circuit 24 respectively to generate the signals OQ and /OQ.

The master latch control circuit 14 shown in FIG. 2 supplies the control power supply voltages PS0, NS0 and ES0 for the master latch circuit 22, and the slave latch control circuit 16 shown in FIG. 2 supplies the control power supply voltages PS1, NS1 and ES1 for the slave latch circuit 24. Further, the latch power supply control circuit 5 shown in FIG. 1 controls the power supply voltage VCCC on the internal power supply line 26. Operations of the flip-flop 12 shown in FIG. 4 are now described with reference to a signal waveform diagram shown in FIG. 5.

In such a normal mode that the pass transistor logic elements perform logical processing, the control power supply voltages PS0 and PS1 are set at the level of a power supply voltage VCC, while the control power supply voltages ES0, NS0, ES1 and NS1 are set at the level of a ground voltage GND. In this state, the transfer clock signals TG1 and TG2 are generated in accordance with an external clock signal (CLK).

When the transfer clock signal TG1 rises to a high level, the transfer circuit 21 is rendered conductive to transmit the data D and /D from the front-stage pass transistor logic element to the master latch circuit 22. Responsively, the voltage levels of the data signals D2 and /D2 change. The pass transistor logic element is formed by pass transistors to simply transmit signals, and has an output signal amplitude thereof being small due to influence of the threshold voltages and channel resistances of the pass transistors.

In the master latch circuit 22, MOS transistors NG1 and NG2 formed by low-Vth MOS transistors change the voltage levels of the internal output nodes OD1 and OD2 in accordance with the signals D2 and /D2. MOS transistors NQ1 and NQ2 have threshold voltages rendered higher than those of the MOS transistors NG1 and NG2, and have driving power of the output nodes OD1 and OD2 made smaller than that of the MOS transistors NG1 and NG2. Thus, MOS transistors NG1 and NG2 determine the latch voltage polarity of the internal output nodes OD1 and OD2. When the voltage levels of the internal output nodes OD1 and OD2 change, a latch circuit formed by the MOS transistors PQ1, PQ2, NQ1 and NQ2 drives the internal output nodes OD1 and OD2 to the levels of the power supply voltage and the ground voltage at a high speed, to generate the signals D3 and /D3.

When the transfer clock signal TG1 falls to a low level, the transfer circuit 21 is rendered non-conductive while the transfer circuit 23 is rendered conductive to transmit the signals D3 and /D3 from the master latch circuit 22 to the slave latch circuit 24. In the slave latch circuit 24, MOS transistors NG3 and NG4 receive the signals D4 and /D4 from the master circuit 22 at the gates thereof for differentially amplifying the same to change the voltage levels of the internal output nodes OD3 and OD4. Also in the slave latch circuit 24, the threshold voltages of MOS transistors NQ3 and NQ4 are larger than those of the MOS transistors NG3 and NG4, which in turn determine the latch voltage polarity of the internal output nodes OD3 and OD4.

When the voltage levels of the internal output nodes OD3 and OD4 change, a latch circuit formed by MOS transistors PQ3, PQ4, NQ3 and NQ4 drives the voltage levels of the internal output nodes OD3 and OD4 to the levels of the power supply voltage and the ground voltage at a high speed and latches the same.

The drive circuit 25 supplies the signals D and /D5 latched by the slave latch circuit 24 to predetermined pass transistor logic elements.

Figure 5:
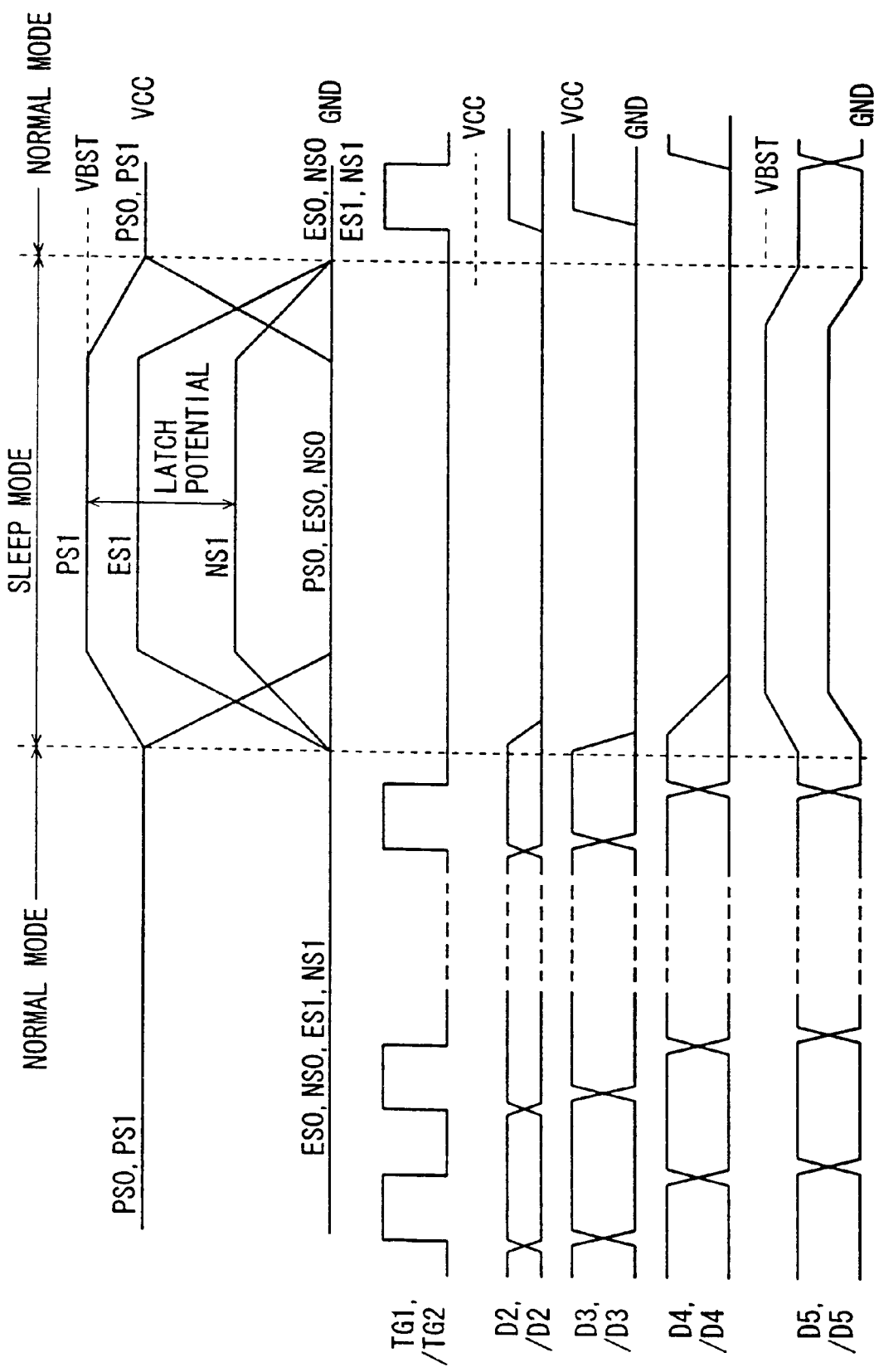
FIG. 5 is a signal waveform diagram representing operations of the flip-flop shown in FIG. 4.

Referring to FIG. 5, both the transfer clock signals TG1 and TG2 are fixed at a low level in such a sleep mode that pass transistor logic elements perform no logical processing. The power supply voltage VCCC on the internal power supply line 26 enters an electrically floating state and lowers to the ground voltage level by discharging as described later. The control power supply voltage PS0 is reduced in level to the ground voltage level while the control power supply voltage PS1 is raised to the level of a boosted voltage VBST higher than the power supply voltage VCC in a normal mode, and the control voltage NS1 is raised to the level of an intermediate voltage between the power supply voltage VCC and the ground voltage GND. In this sleep mode, the signals D2 and /D2 fall to the ground voltage level by discharging. In the master latch circuit 22, both operating power supply voltages reach the ground voltage level, and hence the output signals D3 and /D3 from the master latch circuit 22 also reach the ground voltage level.

In the slave latch circuit 24, the signals D4 and /D4 are in an electrically floating state and the voltage levels thereof remain unchanged (these signal voltage levels lower to the ground voltage due to a leakage current). In this state, the control power supply voltage ES1 is driven to a voltage level higher than the control power supply voltage NS1, to prevent MOS transistors NG3 and NG4 from causing a leakage current flow. Particularly, by setting the control power supply voltage ES1 at the level of the power supply voltage VCC, the gate-to-source voltages of MOS transistors NG3 and NG4 can be set in reverse bias states regardless of the voltage levels of the input signals D4 and /D4, thereby sufficiently suppressing subthreshold currents.

In the slave latch circuit 24, the levels of the control power supply voltages PS1 and NS1 are raised. The control power supply voltages PS1 and NS1 are set at such levels that the slave latch circuit 24 can continuously latch the voltages of the output nodes OD3 and OD4. In the sleep mode, the voltage levels of the output signals D5 and /D5 from the slave latch circuit 24 rise in response to the rise of the control voltages PS1 and NS1. In the sleep mode, the slave latch circuit 24 holds information. In this slave latch circuit 24, MOS transistors PQ3, PQ4, NQ3 and NQ4 are low leakage current MOS transistors, and a leakage current in the sleep mode can be sufficiently suppressed.

In the output drive circuit 25, the power supply voltage VCCC on the internal power supply line 26 lowers to the ground voltage level due to discharging, and hence no leakage current is caused in the inverters (drivers) 25a and 25b either.

In the signal waveform diagram shown in FIG. 5, the signals D4 and /D4 supplied to the slave latch circuit 24 are in electrically floating states and are undefinite (finally discharged to the ground voltage level), and the control power supply voltage ES1 is set at a level substantially close to the level of the power supply voltage VCC. The signals D4 and /D4 finally lower to the ground voltage level due to a leakage current caused through the transfer gates 23a and 23b and the MOS transistors NG1 and NG2. Therefore, the control power supply voltage ES1 may not be particularly raised to the power supply voltage.

The control power supply voltage ES1 is rendered higher than the control power supply voltage NS1 for the following reason: In the sleep mode, the control power supply voltage PS1 is set at the level of the boosted voltage VBST, while the control power supply voltage NS1 is set at the intermediate level of VCC/2, for example. When the control power supply voltage ES1 is set at a level lower than the control power supply voltage NS1, a drain-to-source voltage applied to one of MOS transistors NG3 and NG4 increases to apply large voltage stress to the one MOS transistor over a long period. Setting the control power supply voltage ES1 at a level (the level of the power supply voltage VCC in this embodiment) higher than the intermediate voltage of the control power supply voltage NS1 can prevent application of a high voltage between the drain and the source. If the internal output node OD4 is kept at the intermediate voltage, the source of MOS transistor NG4 is the internal output node OD4. In this state, the gate of MOS transistor NG4 is driven to the ground voltage level due to discharging, whereby its gate-to-source voltage is held in a sufficiently reverse biased state to sufficiently suppress a subthreshold current. Even if such a subthreshold current is generated, the latch (the MOS transistors PQ3, PQ4, NQ3 and NQ4) absorbs the subthreshold current, so that the voltages of the internal output nodes OD3 and OD4 can be reliably kept at constant levels. Also in this case, the control voltage NS1 is rendered higher than the ground voltage and a leakage current path from the power supply node to the ground node is cut off in the slave latch circuit 24, to cause no particular problem.

The slave latch circuit 24 receives the signals D4 and /D4 at the gates of MOS transistors NG3 and NG4 in the sleep mode, and even if a leakage current is caused in the transfer gates 23a and 23b of the transfer circuit 23, no leakage current is caused from the slave latch circuit 24 to the master latch circuit 22 since they are electrically isolated from each other. Therefore, the transfer clock signal TG2 need not be set at a negative voltage in particular, and control is simplified. In order to reliably control the subthreshold current, MOS transistors NG3 and NG4 may be asymmetrically formed such that the sources and the drains thereof are fixed.

Thus, the slave latch circuit 24 can hold the information without causing a leakage current in the sleep mode. Further, supply of the power supply voltage to the internal power supply line 26 is stopped, and hence no leakage current is caused in the drive circuit 25 and other circuits utilizing the power supply voltage VCCC.

Upon transition from the sleep mode to the normal mode, the control power supply voltages PS1 and PS0 are set at the level of the power supply voltage VCC while the control power supply voltages ES1 and NS1 are lowered to the ground voltage level. Thereafter, logical processing is performed in accordance with the transfer clock signals TG1 and TG2.

Figure 6A:
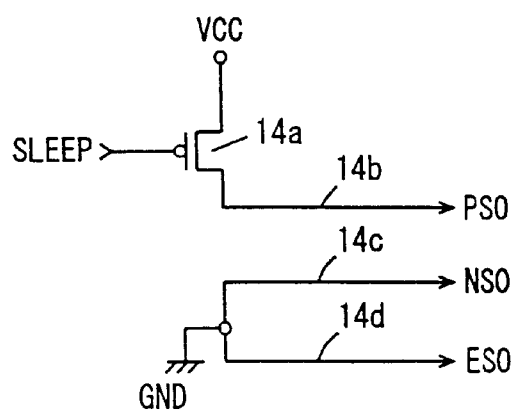
FIG. 6A illustrates the structure of a control power supply voltage generation part of a master latch circuit shown in FIG. 4.

FIG. 6A illustrates the structure of the master latch control circuit 14 in the embodiment 1 of the present invention. Referring to FIG. 6A, the master latch control circuit 14 includes a p-channel MOS transistor 14a for disconnecting the power supply node from a control voltage transmission line 14b in response to activation of a sleep mode instruction signal SLEEP, and control voltage transmission lines 14c and 14d connected to the ground node and transmitting the control power supply voltages NS0 and ES0, respectively. The switching transistor 14a is formed by a high-Vth MOS transistor, to sufficiently reduce a leakage current in a non-conductive state.

In accordance with the structure shown in FIG. 6A, the sleep mode instruction signal SLEEP is at a low level and the switching transistor 14a is rendered conductive to transmit the power supply voltage VCC to the control voltage transmission line 14b in a normal operation mode (normal mode). Therefore, the control power supply voltage PS0 reaches the level of the power supply voltage VCC. In the sleep mode, the sleep mode instruction signal SLEEP goes high and the switching transistor 14a is rendered non-conductive to disconnect the control voltage transmission line 14b from the power supply node. In this state, the voltage level of the control voltage transmission line 14b lowers due to discharging, and the control power supply voltage PS0 lowers to the ground voltage level.

The control power supply voltages NS0 and ES0 are regularly coupled to the ground node and fixed at the level of the ground voltage GND.

Figure 6B:
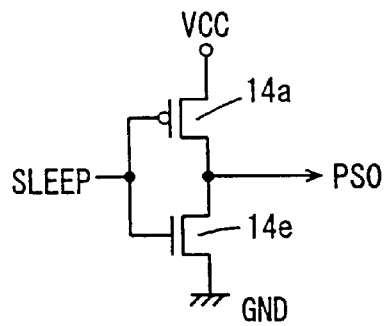
FIG. 6B illustrates a modification of the circuitry of FIG. 6A.

FIG. 6B illustrates a modification of the master latch control circuit 14, and shows the structure of a part generating the control power supply voltage PS0. Referring to FIG. 6B, the master latch control circuit 14 includes an n-channel MOS transistor 14e rendered conductive, in activation of the sleep mode instruction signal SLEEP, for fixing the control power supply voltage PS0 at the ground voltage level, and a p-channel MOS transistor 14a rendered conductive, in inactivation of the sleep mode instruction signal SLEEP, for driving the control power supply voltage PS0 to the level of the power supply voltage VCC. The master latch control circuit 14 shown in FIG. 6B fixes the control power supply voltage PS0 at one of the power supply voltage VCC and the ground voltage GND. In the sleep mode, therefore, the control power supply voltage PS0 can be prevented from electrically floating and the power supply voltage for the master latch can be stably fixed at the ground voltage level.

Figure 7:
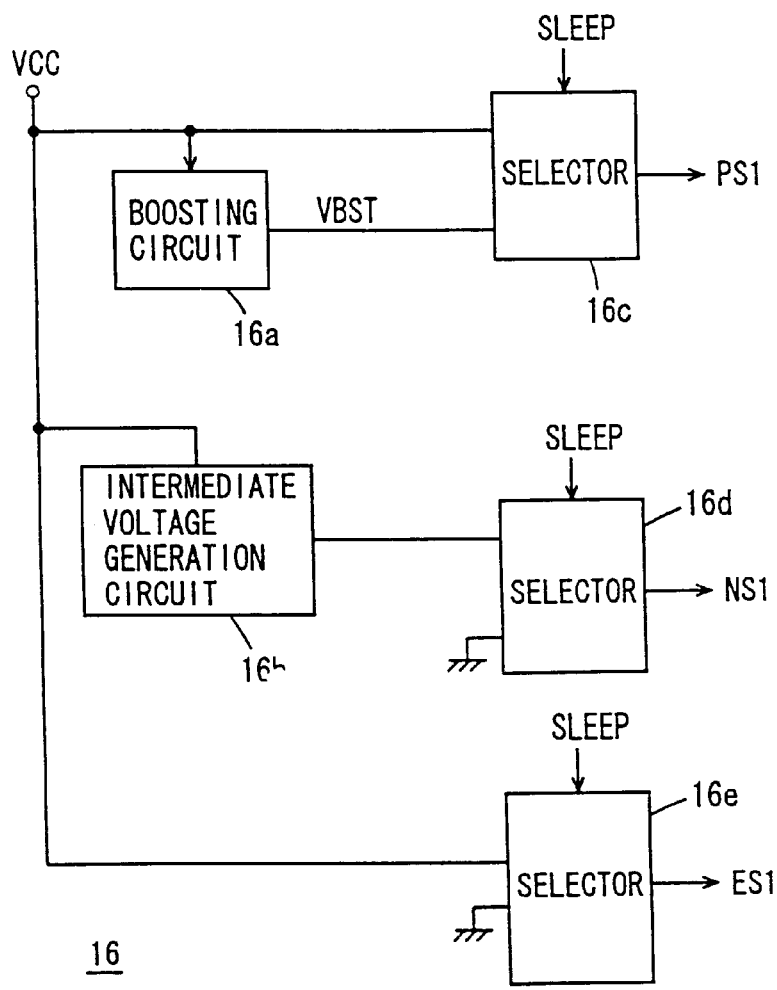
FIG. 7 schematically illustrates the structure of a control power supply voltage generation part of a slave latch circuit shown in FIG. 2.

FIG. 7 schematically illustrates the structure of the slave latch control circuit 16 shown in FIG. 2. Referring to FIG. 7, the slave latch control circuit 16 includes a boosting circuit 16a for boosting the power supply voltage VCC to generate the boosted voltage VBST, an intermediate voltage generation circuit 16b for generating the intermediate voltage in accordance with the power supply voltage VCC, a selector 16c for selecting one of the power supply voltage VCC and the boosted voltage VBST in accordance with the sleep mode instruction signal SLEEP to output the control power supply voltage PS1, a selector 16d for selecting one of the intermediate voltage from the intermediate voltage generation circuit 16b and the ground voltage in accordance with the sleep mode instruction signal SLEEP to output the control power supply voltage NS1, and a selector 16e for selecting one of the power supply voltage VCC and the ground voltage in accordance with the sleep mode instruction signal SLEEP to output the same as the control power supply voltage ES1.

The boosting circuit 16a is formed by a charge pump circuit, for example, and generates the boosted voltage VBST of a predetermined level. The boosting circuit 16a may be activated in the sleep mode. The intermediate voltage generation circuit 16b generates the intermediate voltage of VCC/2, for example, and is implemented by a voltage divider circuit, for example.

The selector 16c selects the boosted voltage VBST in the sleep mode, while selecting the power supply voltage VCC in the normal mode. The selector 16d selects the intermediate voltage from the intermediate voltage generation circuit 16b in the sleep mode, while selecting the ground voltage in the normal mode. The selector 16e selects the power supply voltage VCC in the sleep mode, while selecting the ground voltage in the normal mode.

In the slave latch control circuit shown in FIG. 7, the control power supply voltage ES1 is set at the level of the power supply voltage VCC in the sleep mode. Alternatively, the control power supply voltage ES1 may be set at a level different from the power supply voltage VCC in the sleep mode. The slave latch circuit is only required to be capable of performing latching by the intermediate voltage generated by the intermediate voltage generation circuit 16b and the boosted voltage VBST from the boosting circuit 16a. The voltage difference enabling the slave latch circuit to perform latching is such that among MOS transistors PQ3, PQ4, NQ3 and NQ4 forming the slave latch circuit, MOS transistor to be ON reliably enters ON state while MOS transistor to enter OFF state reliably enters OFF states (a through current must not be caused). Thus, the voltage difference enabling the slave latch circuit to perform latching is appropriately determined in accordance with the absolute values of the threshold voltages of these MOS transistors.

When an output voltage of a voltage down-converter circuit (VDC) down-converting the external power supply voltage Vex is employed as the operating power supply voltage VCC, the control power supply voltage PS1 may be generated utilizing the external power supply voltage Vex and the internal down-converted voltage. In other words, the control power supply voltage PS1 may be set at the level of the external power supply voltage Vex in the sleep mode, and at an internal down-converted voltage Vccd in the normal mode.

The intermediate voltage generation circuit 16e may also be so formed as to generate the predetermined intermediate voltage only in the sleep mode.

Figure 8:
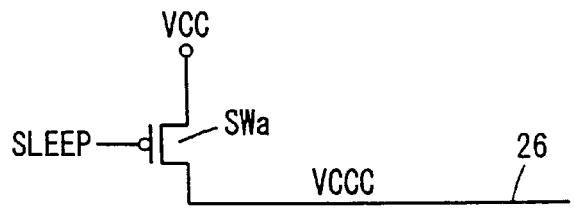
FIG. 8 illustrates the structure of an internal power supply voltage generation part shown in FIG. 4.

FIG. 8 schematically illustrates the structure of a part generating the internal power supply voltage VCC. Referring to FIG. 8, a switching transistor SWa rendered conductive in activation of the sleep mode instruction signal SLEEP is provided between the internal power supply line 26 and the power supply node. The switching transistor SWa has a threshold voltage large in absolute value, to sufficiently reduce a leakage current in a non-conductive state thereof In the power supply control circuit shown in FIG. 8, the power supply node supplies the internal power supply line 26 with the power supply voltage VCC, and the internal power supply voltage VCCC reaches the level of the power supply voltage VCC in the normal mode. In the sleep mode, the switching transistor SWa is rendered non-conductive, the internal power supply line 26 is disconnected from the power supply node, and the internal power supply voltage VCCC on the internal power supply line 26 lowers to the ground voltage level due to a leakage current of the internal power supply line 26. Accordingly, a leakage current in the drive circuit utilizing the internal power supply voltage VCCC on the internal power supply line 26 as the operating power supply voltage is suppressed.

The switching transistors 14a and SWa shown in FIGS. 6A and 8 respectively are identical in function to each other. However, the control power supply voltage transmission line 14b and the internal power supply line 26 are provided independently of each other. Thus, the operations of the master latch circuit and the output chive circuit are prevented from mutually exerting adverse influence and causing fluctuation of the power supply voltages, thereby implementing a stably operating flip-flop.

Further, power supply sources are provided independently for the master latch circuit and for the slave latch circuit, to suppress mutual influence of the operations of these circuits.

According to the embodiment 1 of the present invention, as hereinabove described, the logic element performing logical processing is formed by pass transistors and the output signal of the pass transistor logic element is supplied to the gates of the MOS transistors, whereby no path causing a leakage current is present in the pass transistor logic element, and the logic element can be implemented with MOS transistors having low threshold voltages, and a logic circuit operating at a high speed with low power consumption can be implemented.

In the sleep mode, further, power supply to the master latch circuit is stopped to cut off a path causing a leakage current, while in the slave latch circuit, the voltage level of the power supply node is raised to set MOS transistors in deep OFF states to cause no leakage current with data held therein reliably latched. Thus, the information can be stably held with low current consumption also in the standby cycle in addition, the power supply voltage is changed simply in the flip-flops between the pass transistor logic elements to hold the information, and information need not be saved through another path, whereby the signals can be readily held with a simple circuit structure.

Embodiment 2

Figure 9:
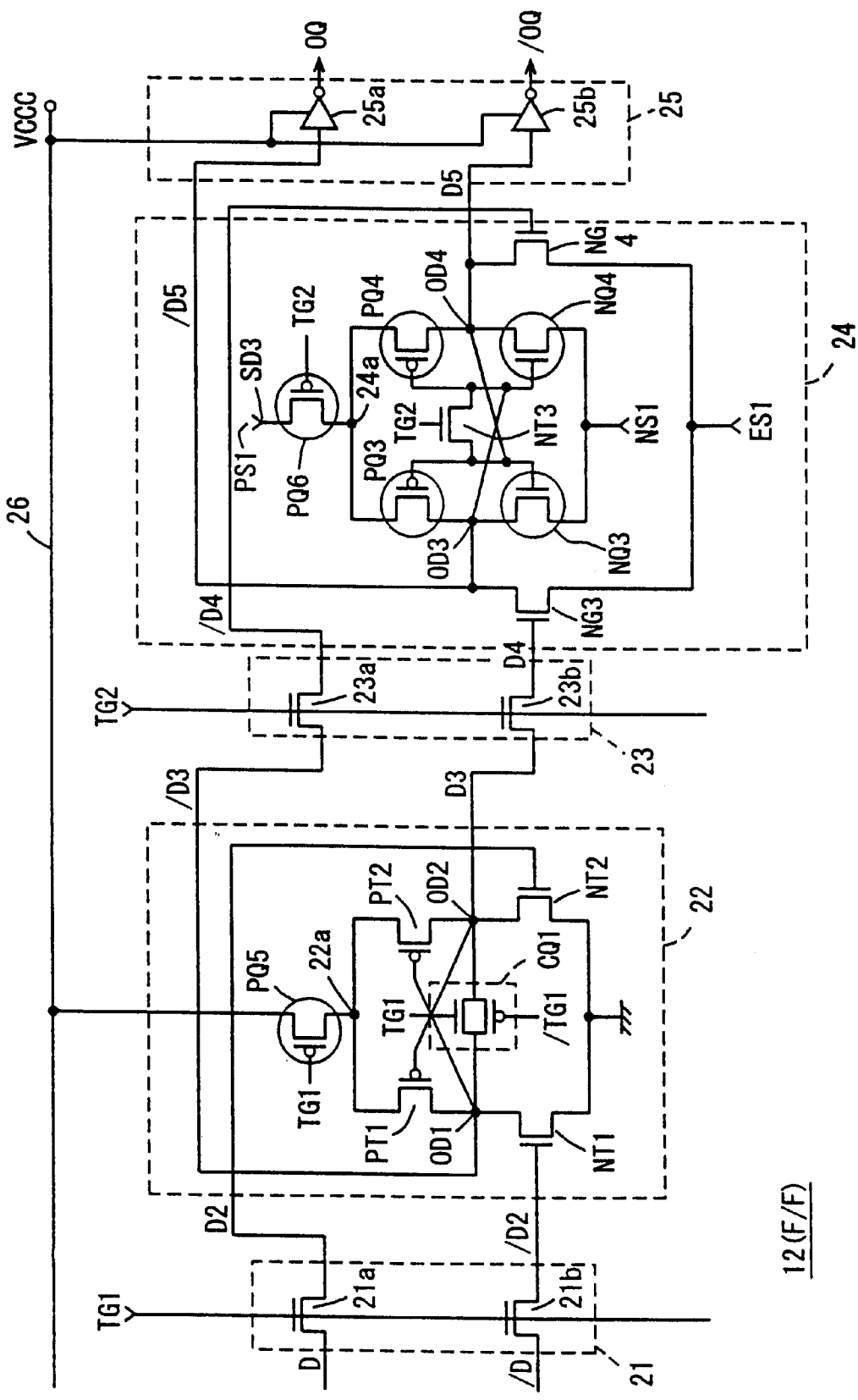
FIG. 9 illustrates the structure of a flip-flop according to an embodiment 2 of the present invention.

FIG. 9 illustrates the structure of a flip-flop 12 according to an embodiment 2 of the present invention. Referring to FIG. 9, a master latch circuit 22 includes an n-channel MOS transistor NT1 connected between an internal output node OD1 and a ground node and receiving a signal /D2 supplied through a transfer gate 21b at its gate, an n-channel MOS transistor NT2 connected between an internal output node OD2 and the ground node and receiving a signal D2 supplied through a transfer gate 21a at its gate, a transmission gate CQ1 rendered conductive, when a transfer c clock signal TG1 is at a high level, for electrically short-circuiting the internal output nodes OD1 and OD2, a p-channel MOS transistor PT1 connected between an internal node 22a and the internal output node OD1 with a gate thereof connected to the internal output node OD2, a p-channel MOS transistor PT2 connected between the internal node 22a and the internal output node OD2 with a gate thereof connected to the internal output node OD1, and a p-channel MOS transistor PQ5 connected between an internal power supply line 26 and the internal node 22a and receiving the transfer clock signal TG1 at its gate. MOS transistors PT1, PT2, NT1 and NT2 are formed by low-Vth transistors, while the MOS transistor PQ5 is formed by a low leakage current MOS transistor.

A slave latch circuit 24 is different in structure from the slave latch circuit 24 shown in FIG. 4 in the following points: A p-channel MOS transistor PQ6 selectively rendered conductive in response to a transfer c clock signal TG2 is provided between a common source node 24a of MOS transistors PQ3 and PQ4 and an internal power supply node SD3, while an n-channel MOS transistor NT3 is provided for equalizing the voltages of the internal output nodes OD3 and OD4 when the transfer clock signal TG2 is at a high level. The remaining structure is identical to that shown in FIG. 4, and corresponding parts are denoted by the same reference numerals, to omit description thereof.

In the structure shown in FIG. 9, both the master latch circuit 22 and the slave latch circuit 24 perform dynamic operations of equalizing the associated internal output nodes in response to the transfer clock signals TG1 and TG2, respectively. The master latch circuit 22 can amplify small amplitude signals supplied from a front-stage pass transistor logic element at a high speed by equalizing the internal output nodes OD1 and OD2. In a general pass transistor logic element, a plurality of pass transistors are serially connected and the amplitudes of signals passed through the pass transistors are reduced due to influence of channel resistance and such. The master latch circuit 22 receives output signals D and /D of the pass transistor logic element at the gates of the MOS transistors NT1 and NT2, and no path (from the power supply node to the ground node) causing a current is present in the pass transistor logic element. Therefore, the pass transistor logic element can be formed by low-Vth MOS transistors for implementing high-speed logical processing. Operations of the flip-flop 12 shown in FIG. 9 in a normal mode are now described with reference to a signal waveform diagram shown in FIG. 10.

The transfer clock signals TG1 and TG2 are generated in synchronization with a clock signal CLK, which in turn is an external system clock, for example. The transfer clock signals TG1 and TG2 are non-overlapping two-phase or complementary clock signals.

When the transfer clock signal TG1 is at a high level, transfer circuit 21 is rendered conductive to supply the output signals D and /D from the front-stage pass transistor logic element to the master latch circuit 22. In the master latch circuit 22, the power supply transistor PQ5 is non-conductive and the transmission gate CQ1 is conductive. Therefore, the voltage levels of the internal output nodes OD1 and OD2 are equalized. MOS transistors NT1 and NT2 receive signals /D2 and D2 from the front-stage pass transistor logic element and the conductances thereof change. Therefore, signals /D3 and D3 from the internal output nodes OD1 and OD2 are disoleargd by one of the MOS transistors NT1 and NT2, and the voltage levels thereof are kept equal to each other and gradually lower. Also in this case, however, the power supply transistor PQ5 is non-conductive and hence no path is present to flow a current from the internal power supply line 26 to the ground node, and no current is consumed.

The slave latch circuit 24 latches signals supplied in a precedent c clock cycle since the transfer clock signal TG2 is at a low level.

When the transfer clock signal TG1 goes low, the transfer circuit 21 is rendered non-conductive, while a transfer circuit 23 is rendered conductive. In the master latch circuit 22, the transmission gate CQ1 is rendered non-conductive, the power supply transistor PQ5 is rendered conductive, and a latch operation starts. In accordance with the non-conductive state of the transmission gate CQ1, the voltage level of one of the output nodes OD1 and OD2 further lowers. The p-channel MOS transistors PT1 and PT2 having cross-coupled gates and drains pull up the other one of the internal output nodes OD1 and OD2 to the level of a power supply voltage VCC (VCCC). The cross-coupled p-channel MOS transistors PT1 and PT2 latch the pulled-up signal. Output signals D3 and /D3 of the master latch circuit 22 are supplied to the slave latch circuit 24 through the transfer circuit 23.

In the slave latch circuit 24, the MOS transistor NT3 is conductive and the power supply transistor PQ6 is non-conductive, and the voltages of the internal output nodes OD3 and OD4 are equalized. The voltage levels of the internal output nodes OD3 and OD4 lower in accordance with signals D4 and /D4. In the slave latch circuit 24, a control power supply voltage PS1 is set at the level of the power supply voltage VCC, while control power supply voltages NS1 and ES1 are fixed at the level of a ground voltage, similarly to the embodiment 1. When the transfer clock signal TG2 is at a high level, therefore, the slave latch circuit 24 is in an equalize state and signals OQ and /OQ from an output chive circuit 25 are at the same voltage level.

When the transfer clock signal TG2 goes low, MOS transistor NT3 is rendered non-conductive while the power supply transistor PQ6 is rendered conductive in the slave latch circuit 24 a latch circuit formed by MOS transistors PQ3, PQ4, NQ3 and NQ4 is rendered operative, and the voltage levels of the internal output nodes OD3 and OD4 are driven to the power supply voltage level and the ground voltage level in accordance with the voltage levels of the signals D4 and /D4, and then latched.

The aforementioned operation is repeated in accordance with the transfer clock signals TG1 and TG2.

When the master latch circuit is formed by a dynamic latch circuit (equalizing output nodes thereof to a prescribed voltage level in accordance with a clock signal), change of the output signals starts at an intermediate voltage level and the small amplitude signals from the front-stage pass transistor logic element can be amplified at a high speed. Further, current consumption in the equalize operation can be eliminated by rendering the power supply transistors PQ5 and PQ6 non-conductive during the equalize operation period of the master latch circuit 22 and the slave latch circuit 24, implementing a flip-flop operating with low current consumption. In addition, the pass transistor logic element causes no leakage current, and can be formed by low-Vth MOS transistors since the output signals D and /D are supplied to the gates of MOS transistors NT1 and NT2 of the master latch circuit 22.

In the sleep mode, the power supply voltage VCCC on the internal power supply line 26 lowers to the ground voltage level due to cut off from the power supply node, similarly to the embodiment 1. Further, the control power supply voltages PS1, NS1 and ES1 are also set at the level of a boosted voltage similarly to the embodiment 1, and information can be latched with a low leakage current.

Figure 10:
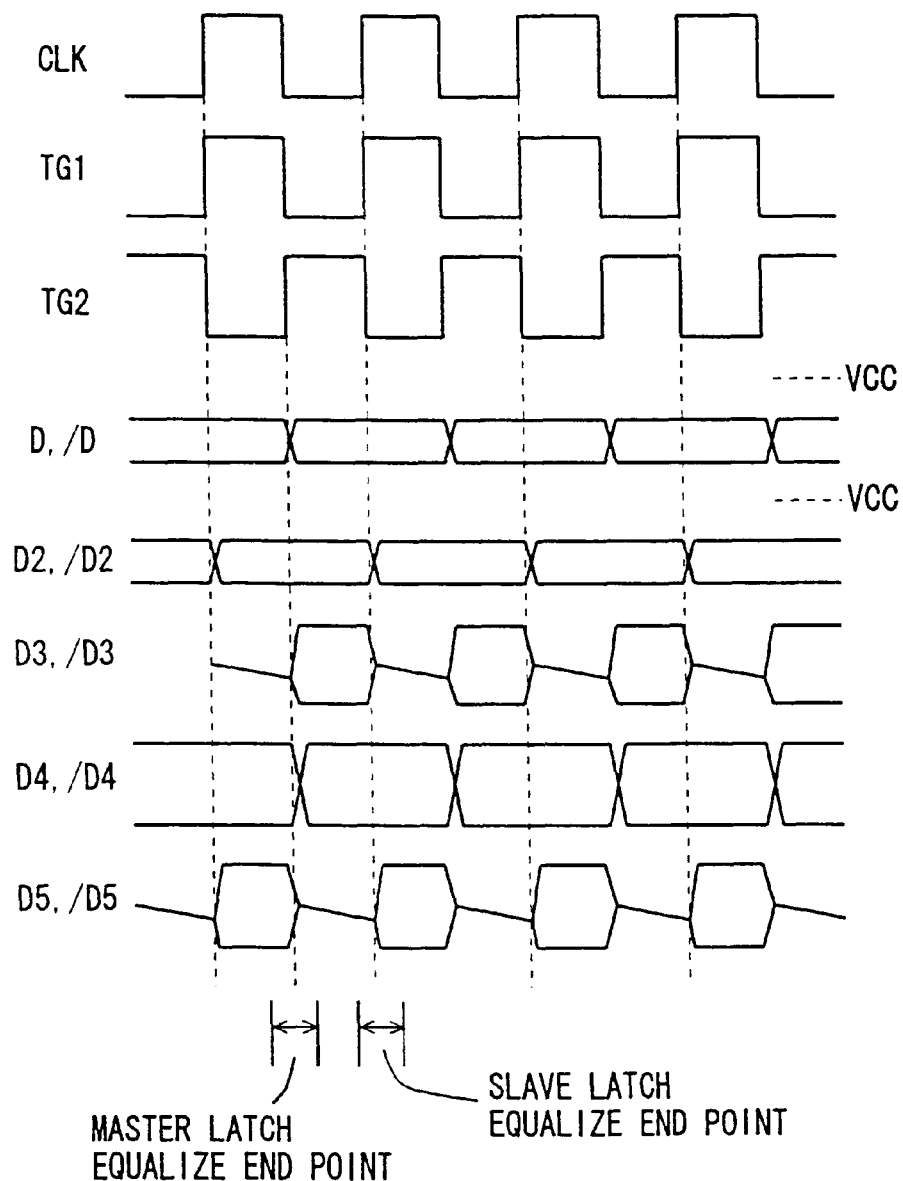
FIG. 10 is a signal waveform diagram representing operations of the flip-flop shown in FIG. 9.

In the structure shown in FIG. 9, the master latch circuit 22 and the slave latch circuit 24 perform equalizing operations in accordance with the transfer clock signals TG1 and TG2. However, the equalizing operations may be completed when voltages of adequate amplitudes are transmitted. As shown in FIG. 10, the equalizing operation of the master latch circuit 22 may be terminated within a certain time width with respect to fall of the transfer clock signal TG1 while the equalizing operation of the slave latch circuit may be terminated within a period of a certain time width with respect to fall of the transfer clock signal TG2.

Figure 11:
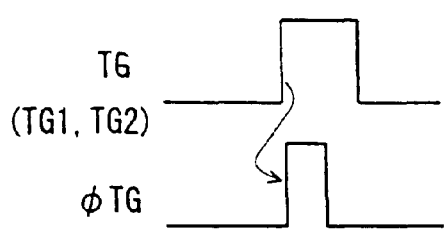
FIG. 11 is a signal waveform diagram representing operations of a modification of the embodiment 2 of the present invention.

Alternatively, as shown in FIG. 11, the master latch circuit 22 and the slave latch circuit 24 may be adapted to perform equalize operations in accordance with a one-shot pulse signal $\phi$TG going high for a prescribed period in response to rise of transfer clock signals TG (TG1 and TG2).

According to the embodiment 2 of the present invention, as hereinabove described, the master latch circuit is formed by a dynamic latch circuit, whereby small amplitude signals can be amplified at a high speed. Further, both the master latch circuit and the slave latch circuit are cut off from the power supply nodes in the equalizing operations, whereby current consumption during the equalizing operations can be reduced.

For a control circuit for generating the control power supply voltages in the embodiment 2, a structure similar to that of the embodiment 1 can be utilized.

Embodiment 3

Figure 12:
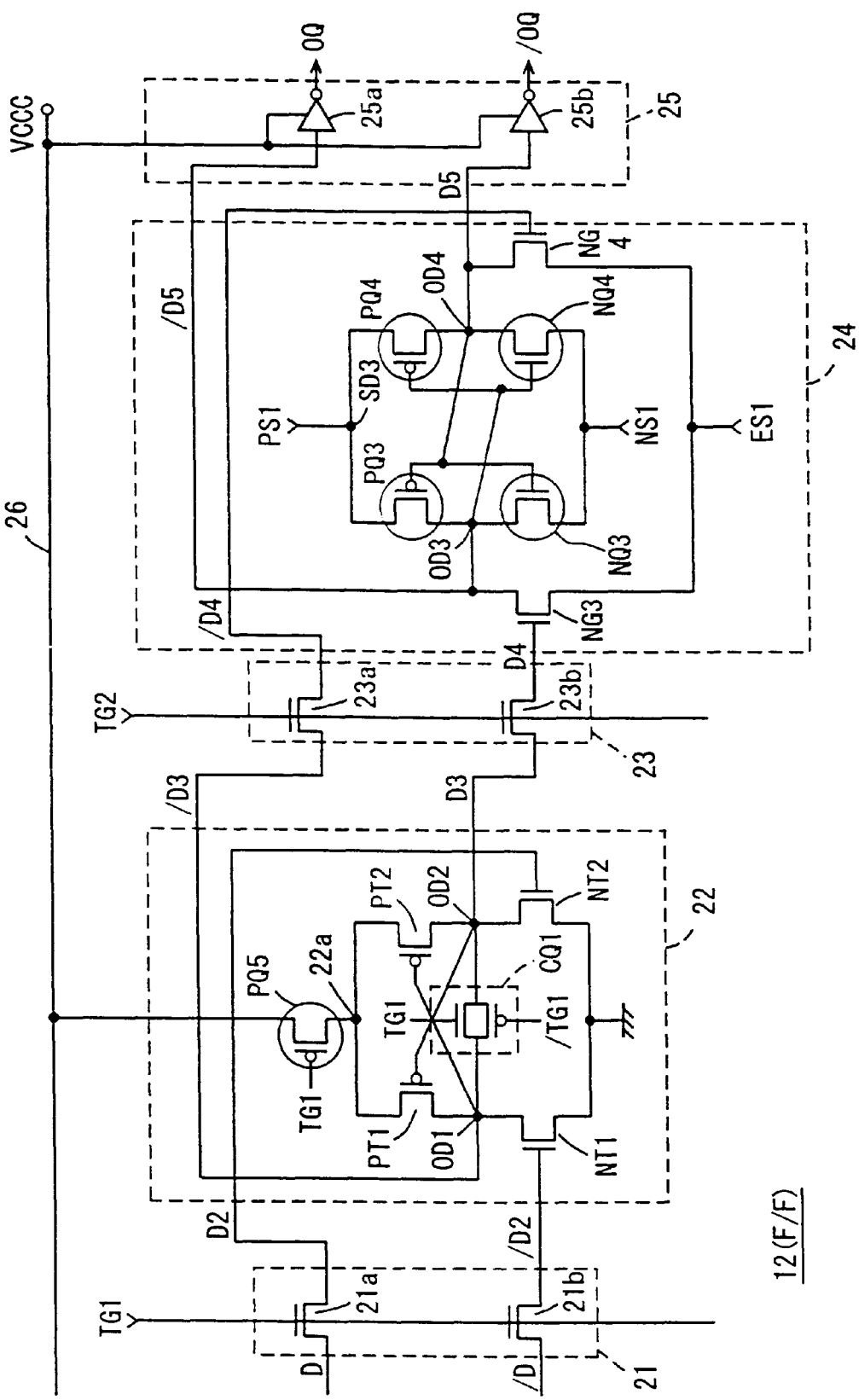
FIG. 12 illustrates the structure of a flip-flop according to an embodiment 3 of the present invention.

FIG. 12 illustrates the structure of a flip-flop 12 according to an embodiment 3 of the present invention. In the flip-flop 12 shown in FIG. 12, the structure of a slave latch circuit 24 is different from that shown in FIG. 9, but identical to that of the master latch circuit 22 shown in FIG. 9. The slave latch circuit 24 is formed by a static latch circuit the same as the slave latch circuit shown in FIG. 4. A master latch circuit 22 is formed by the dynamic latch circuit, similarly to the embodiment 2 shown in FIG. 9. Since master latch circuit 22 shown in FIG. 12 is identical in structure to the master latch circuit shown in FIG. 9, and corresponding parts are denoted by the same reference numerals, to omit description thereof. The slave latch circuit 24 is identical in structure to the slave latch circuit 24 shown in FIG. 4, and corresponding parts are denoted by the same reference numerals, to omit description thereof In the structure of the flip-flop shown in FIG. 12, the master latch circuit 22 performs a dynamic operation (equalization of internal output nodes) in accordance with a transfer clock signal TG1. Also when amplitudes of signals from the front-stage pass transistor logic element are small, the master latch circuit 22 can amplify the small amplitude signals at a high speed to generate internal signals D3 and /D3.

Figure 13:
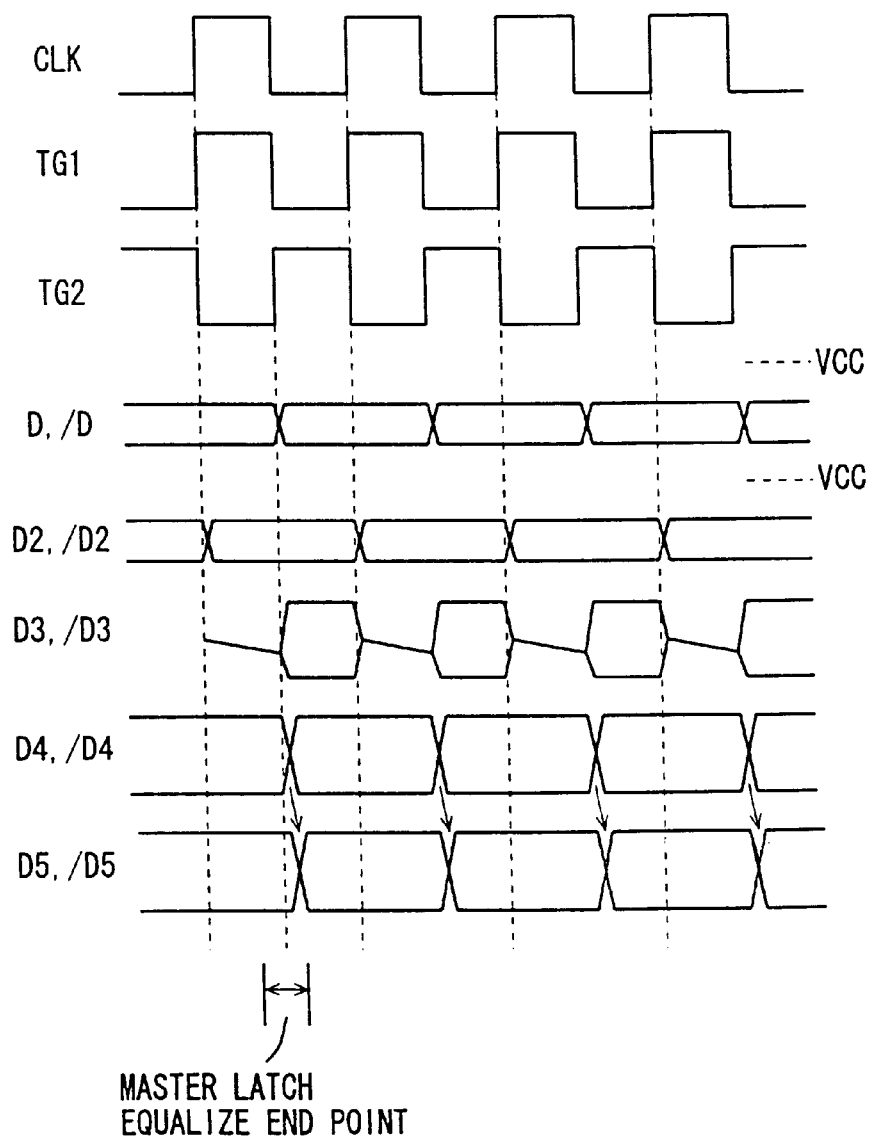
FIG. 13 is a signal waveform diagram representing operations of the flip-flop shown in FIG. 12.

On the other hand, the slave latch circuit 24 statically operates as shown in a waveform diagram in FIG. 13, and amplifies signals D4 and /D4 supplied through transfer circuit 23 at a high speed in accordance with transfer clock signal TG2. Therefore, output signals D5 and /D5 of the slave latch circuit 24 change in accordance with the transfer clock signal TG2 and are latched for one clock cycle period of the transfer clock signal TG2. Therefore, the back-stage pass transistor logic element can operate with a margin to effect a high-speed operation in accordance with a high-speed c clock CLK.

The operation of the master latch circuit 22 is identical to that of the master latch circuit according to the embodiment 2 shown in FIG. 9.

In the sleep mode, the flip-flop 12 has control power supply voltages controlled similarly to the embodiment 1, to discharge power supply voltage VCCC on internal power supply line 26 to the level of ground voltage through a leakage current thereof while raising the levels of control power supply voltages PS1, NS1 and ES1 to latch signals with no leakage currents.

According to the embodiment 3 of the present invention, as hereinabove described, the master latch circuit and the slave latch circuit are formed by dynamic and static latch circuits respectively, whereby signals of small amplitudes can be amplified at a high speed while sustainably outputting signals in a one-c clock cycle period, implementing a logic circuit device operating at a high speed.

Embodiment 4

Figure 14:
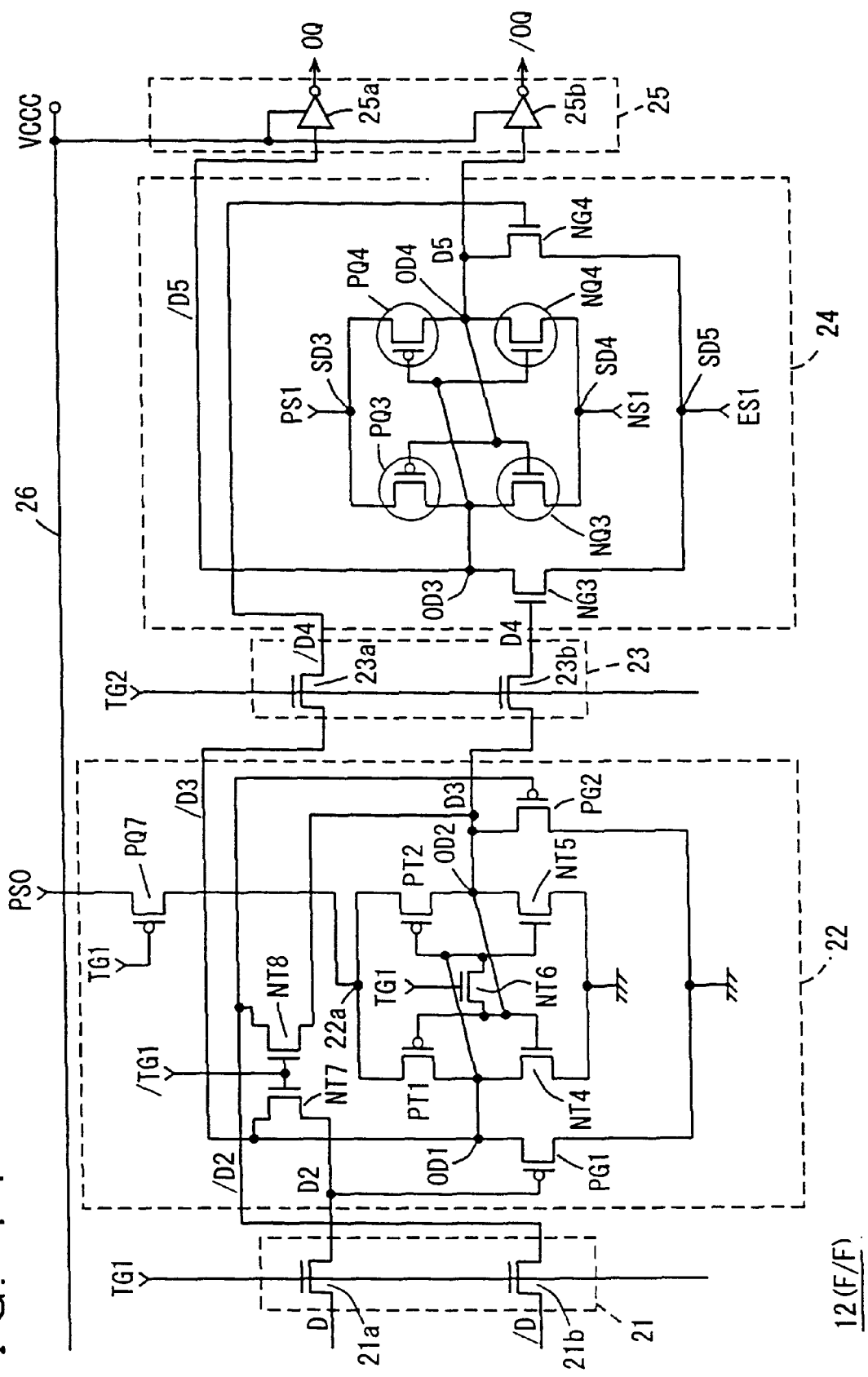
FIG. 14 illustrates the structure of a flip-flop according to an embodiment 4 of the present invention.

FIG. 14 illustrates the structure of a flip-flop 12 according to an embodiment 4 of the present invention. In the flip-flop 12 shown in FIG. 14, the structure of a master latch circuit 22 is different from that shown in FIG. 12.

Referring to FIG. 14, the master latch circuit 22 includes a p-channel MOS transistor PG1 connected between an internal output node OD1 and a ground node and receiving a signal D2 from a transfer circuit 21 at its gate, a p-channel MOS transistor PG2 connected between an internal output node OD2 and the ground node and receiving a signal /D2 from the transfer circuit 21 at its gate, an n-channel MOS transistor NT4 connected between the internal output node OD1 and the ground node with a gate thereof connected to the internal output node OD2, an n-channel MOS transistor NT5 connected between the internal output node OD2 and the ground node with a gate thereof connected to the internal output node OD1, a p-channel MOS transistor PT1 connected between a common source node 22a and the internal output node OD1 with a gate thereof connected to the internal output node OD2, a p-channel MOS transistor PT2 connected between the common source node 22a and the internal output node OD2 with a gate thereof connected to the internal output node OD1, and an n-channel MOS transistor NT6 rendered conductive in response to a transfer clock signal TG1 for electrically short-circuiting the internal output nodes OD1 and OD2. MOS transistors PT1, PT2, NT4 and NT5 operate as CMOS inverter latch in operation.

The master latch circuit 22 further includes a power supply transistor PQ7 transmitting a control power supply voltage PS0 to common source node 22 in response to the transfer clock signal TG1, an n-channel MOS transistor NT7 connecting the internal output node OD1 with a transfer gate 21a in response to a complementary transfer clock signal /TG1, and an n-channel MOS transistor NT8 connecting the internal output node OD2 to the transfer gate 21a in response to the complementary transfer clock signal /TG1. MOS transistors NT7 and NT8 are rendered conductive complimentarily to MOS transistor NT6, for setting the signal D2 and a signal /D3 at the same potential while setting the signal /D2 and a signal D3 at the same potential.

The power supply transistor PQ7 receives a control power supply voltage PS0. MOS transistor PQ7 may be formed by a low-Vth MOS transistor may be formed by a low leakage current MOS transistor similarly to the embodiment 3, or may be connected to an internal power supply line 26. The remaining structure of the flip-flop 12 shown in FIG. 14 is identical to that shown in FIG. 12, and corresponding parts are denoted by the same reference numerals, to omit description thereof.

Figure 15:
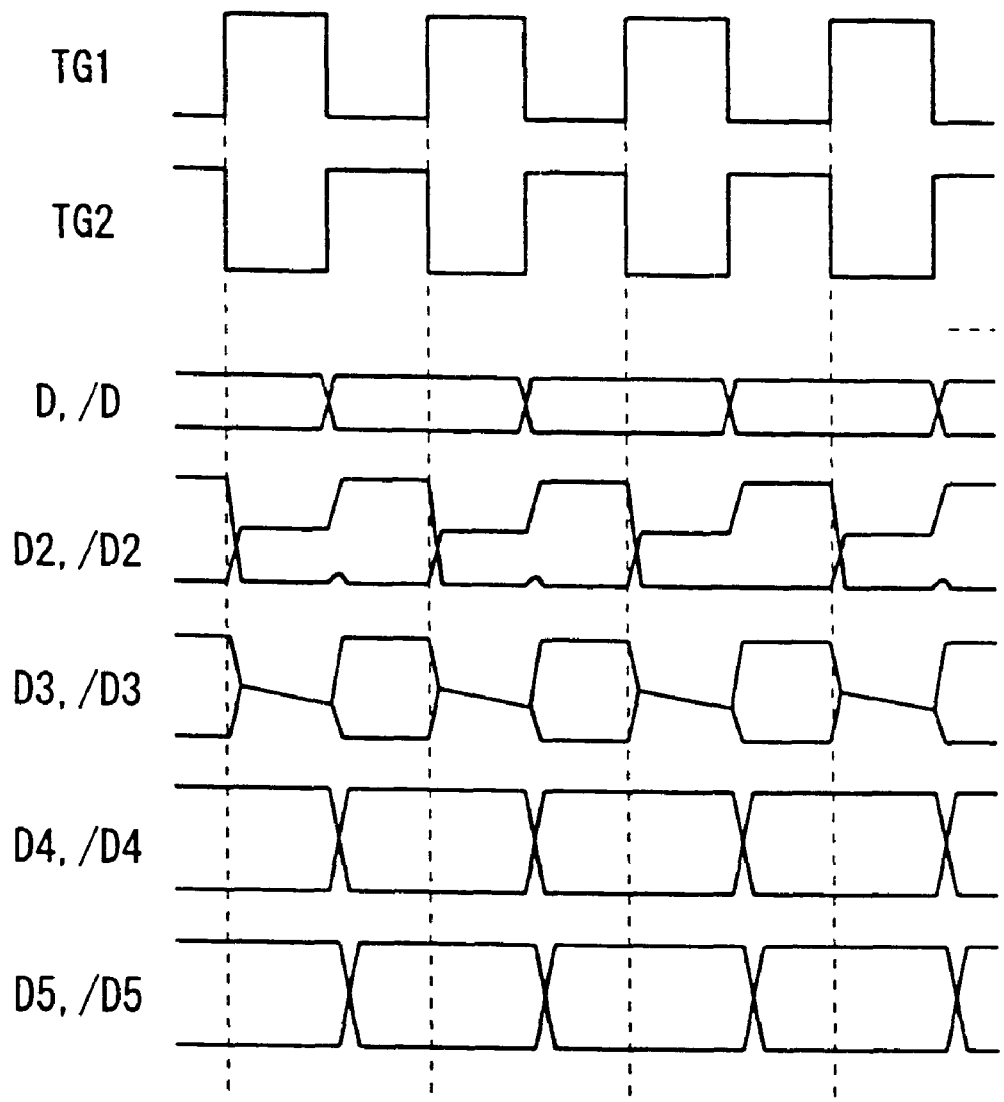
FIG. 15 is a signal waveform diagram representing operations of the flip-flop shown in FIG. 14.

Operations of the flip-flop 12 shown in FIG. 14 in a normal mode are now described with reference to a signal waveform diagram shown in FIG. 15. When the transfer clock signal TG1 is at a high level, the transfer circuit 21 is conductive while transfer circuit 23 is non-conductive. Therefore, slave latch circuit 24 is in a latch state for latching signals taken in a precedent cycle and outputs the latched signals through output drive circuit 25.

In the master latch circuit 22, the conductances of p-channel MOS transistors PG1 and PG2 change in accordance with the signals D2 and /D2 supplied through the transfer circuit 21. MOS transistor NT6 is conductive, and hence the internal output nodes OD1 and OD2 are electrically short-circuited and the internal signals /D3 and D3 are at the same voltage level. The p-channel MOS transistors PG1 and PG2 receive the signals D2 and /D2 at the gates thereof, so that the voltage levels of the internal output nodes OD1 and OD2 lower through MOS transistors PG1 and PG2 even if the signals D2 and /D2 are of small amplitudes (the sources of the p-channel MOS transistors in ON states are provided by the internal output nodes). The power supply transistor PQ7 is non-conductive, to stop a latch operation of a latch circuit formed by MOS transistors PT1, PT2, NT4 and NT5.

When the transfer clock signal TG1 falls to a low level, the power supply transistor PQ7 is rendered conductive while the MOS transistor NT6 for equalization is rendered non-conductive, and the latch operation is started. At this time, MOS transistors NT7 and NT8 are rendered conductive to connect the internal output nodes OD1 and OD2 to the transfer gates 21a and 21b, respectively. The internal signals D3 and /D3 are driven in accordance with the signals D2 and /D2 due to the latch operation of the latch circuit formed by MOS transistors PT1, PT2, NT4 and NT5. The change of the signals D3 and /D3 is intersectantly fed back to the signals /D2 and D2. Therefore, one of the signals D2 and /D2 is raised to a power supply voltage level thereby completely turning off one of the MOS transistors PG1 and PG2 to prevent a leakage current when the signal D2 is at a high level, for example, the signal /D3 is driven to the power supply voltage level and the signal D2 is also driven to the power supply voltage level in response. Even if small amplitude signals are transmitted from the front-stage pass transistor logic element, the master latch circuit 22 enlarges the amplitudes of the input signals D2 and /D2 to the power supply voltage level for preventing the node of a high-level of the internal output nodes OD1 and OD2 from being discharged through one of MOS transistors PG1 and PG2 and reducing current consumption.

When the transfer clock signal TG1 is at a low level, the transfer circuit 23 is rendered conductive to transmit the signals D3 and /D3 to the slave latch circuit 24. The slave latch circuit 24 receives signals D4 and /D4 at the gates of MOS transistors NG3 and NG4. Therefore, the master latch circuit 22 is merely required to drive internal signal lines thereof and the capacitance of an input gate of the slave latch circuit, and therefore can transmit the signals D3 and /D3 to the slave latch circuit 24 through the transfer circuit 23.

The slave latch circuit 24 is a static latch circuit similarly to the embodiment3, generates output signals D5 and /D5 in accordance with the input signals D4 and /D4 and outputs the same through the output drive circuit 25.

The control power supply voltage PS0 is at the level of power supply voltage VCC in the normal mode, while discharged to ground voltage level similarly to the power supply voltage VCC on the internal power supply line 26 in the sleep mode. Also in the slave latch circuit 24, control power supply voltages PS1, NS1 and ES1 are driven similarly to the embodiment 1.

Also in the structure shown in FIG. 14, the master latch circuit 22 is formed by a dynamic latch circuit and can amplify the small amplitude signals from the front-stage pass transistor logic element at a high speed. Particularly, by receiving output signals D and /D from the front-stage pass transistor logic element at the gates of the p-channel MOS transistors PG1 and PG2 in the master latch circuit 22, MOS transistors PG1 and PG2 can be set in deeper ON states with the small amplitude signals as compared to the case of employing n-channel MOS transistors, for changing the voltage levels of the internal output nodes OD1 and OD2 at a high speed in a latch operation and implementing a high-speed latch operation. Further, by intersectantly (coupling the signal D2 with the signal /D3 while coupling the signal /D2 with the signal D3) feeding back output signals of the master latch circuit 22 to the input part thereof in a latch state, high-level input signal can be driven to the power supply voltage level, MOS transistors PG1 and PG2 can be reliably set in OFF states and leakage currents can be reduced.

The structure of the control power supply voltage generation part in the embodiment 1 can be utilized for a part generating the control power supply voltages for the structure shown in FIG. 14.

Embodiment 5

FIG. 16 illustrates the structure of a flip-flop 12 according to an embodiment 5 of the present invention. In the flip-flop 12 shown in FIG. 16, a slave latch circuit 24 includes n-channel MOS transistors NT10 and NT11 rendered conductive in response to activation of a power down mode instruction signal PD for driving gates of n-channel MOS transistors NG3 and NG4 to a ground voltage, respectively. The remaining structure of the slave latch circuit 24 is identical to the structure shown in FIG. 4, and corresponding parts are denoted by the same reference numerals to omit description thereof Master latch circuit 22 includes MOS transistors PT1, PT2, NT4 and NT5 forming a latch stage latching the voltages of internal output nodes OD1 and OD2 when active, n-channel MOS transistors NT1 and NT2 differentially amplifying output signals D2 and /D2 of transfer circuit 21 for transmission onto the internal output nodes OD1 and OD2, and a p-channel MOS transistor PQ7 rendered conductive, when a transfer clock signal TG1 is at a low level, for transmitting a control power supply voltage PS0 to a common source node 22a of the latch stage. The p-channel MOS transistor PQ7 may be formed by a low leakage current MOS transistor, or may be coupled to receive a power supply voltage VCCC on an internal power supply line 26 in place of the control power supply voltage PS0.

The master latch circuit 22 shown in FIG. 16 is a dynamic latch circuit, and has the voltages of the internal output nodes OD1 and OD2 equalized when the transfer clock signal TG1 is at a high level. When the transfer clock signal TG1 goes low, the latch stage of master latch circuit 22 is activated to drive and latch the voltage levels of the internal output nodes OD1 and OD2 in response to the signals D2 and /D2 supplied from the front-stage pass transistor logic element. The master latch circuit 22 may have any structure of the master latch circuits according to the embodiments 1 to 4.

In a normal mode, the slave latch circuit 24 statically operates to differentially amplify and latch signals D4 and /D4 supplied through transfer circuit 23 for outputting. The structure of a latch part of the slave latch circuit 24 may also be any of the embodiments 1 to 4.

In a power down mode, the power down mode instruction signal PD goes high and the MOS transistors NT10 and NT11 are rendered conductive. In this power down mode, the control power supply voltage PS0 is discharged to ground voltage level, control power supply voltage PS1 is set at a level higher than power supply voltage VCC and control voltages ES1 and NS1 are raised to predetermined voltage levels from the ground voltage level.

In the power down mode, the gates of MOS transistors NG3 and NG4 are fixed at the ground voltage level. If the gates of the MOS transistors NG3 and NG4 enter electrically floating states and the voltage levels of the MOS transistors NG3 and NG4 are instable depending on the voltage levels of the signals D4 and /D4 before the power down mode, the control power supply voltage ES1 must be set at a sufficiently high level (e.g., at the level of the power supply voltage VCC) in consideration of the instable voltage levels. However, MOS transistors NT10 and NT11 fix the gates of the MOS transistors NG3 and NG4 at the ground voltage level, whereby MOS transistors NG3 and NG4 can be set in sufficiently deep OFF states to prevent leakage currents even if the control power supply voltage ES1 is set at an intermediate level. Therefore, even with the control power supply voltages NS1 and ES1 set at the equal voltage level (e.g., an intermediate voltage VCC/2), for example, leakage currents can be sufficiently suppressed in the power down mode.

The term "power down mode" stands for such an operating mode that the flip-flop simply must hold information when a system power supply is cut off. The term "sleep mode" stands for such an operating mode that a sleep mode instruction signal SLEEP is activated under control of a controller (CPU) when no logical processing is performed for a prescribed period and signal states remain unchanged under supply of system power. However, the power down mode and the sleep mode may be identical to each other. As shown in parentheses in FIG. 16, therefore, the sleep mode instruction signal SLEEP may be supplied to the gates of MOS transistors NT10 and NT11 in place of the power down mode instruction signal PD. Also in the sleep mode, a leakage current can be reduced while correctly holding information, the control power supply voltage ES1 can be set at a low level, and current consumption is reduced.

According to the embodiment 5 of the present invention, as hereinabove described, the gates of the MOS transistors of a signal input stage of the slave latch circuit are fixed at the ground voltage level in the power-down or sleep mode, whereby information can be stably held with a low control power supply voltage, and leakage currents can be suppressed even if the gates of the MOS transistors of the input stage enter electrically floating states in information holding.

Embodiment 6

Figure 17:
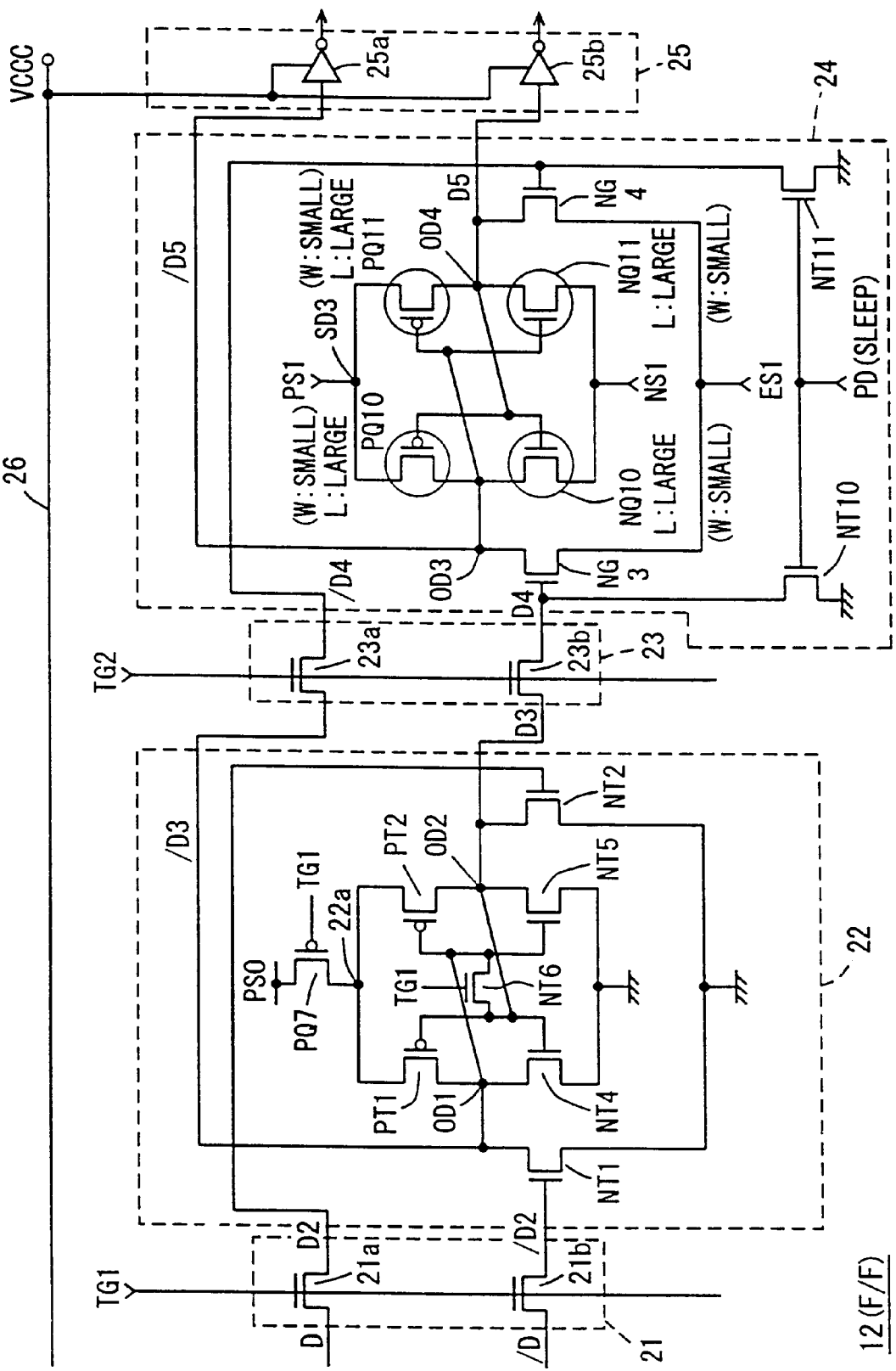
FIG. 17 illustrates the structure of a flip-flop according to an embodiment 6 of the present invention.

FIG. 17 illustrates the structure of a flip-flop 12 according to an embodiment 6 of the present invention. In flip-flop 12 shown in FIG. 17, a slave latch circuit 24 includes p-channel MOS transistors PQ10 and PQ11 and n-channel MOS transistors NQ10 and NQ11 having longer channel lengths L than the remaining MOS transistors in place of the p-channel MOS transistors PQ3 and PQ4 and the n-channel MOS transistors NQ3 and NQ4. The remaining structure is identical to that shown in FIG. 16, and corresponding parts are denoted by the same reference numerals, to omit description thereof.

A refined MOS transistor has a so-called "short channel effect". This short channel effect is caused by influence of a drain voltage exerted onto a source. When a channel length L reduces, a depletion layer resulting from a drain electric field readily reaches the source to readily form an inversion layer and reduce the absolute value of the threshold voltage. In other words, the threshold voltage has dependency on the channel length L. In the slave latch circuit 24, the channel lengths L of the MOS transistors PQ and NQ forming a latch stage are rendered larger than those of the remaining MOS transistors PT, NT and NG. Thus, the absolute values of the threshold voltages of the MOS transistors PQ10, PQ11, NQ10 and NQ11 exceed those of the remaining MOS transistors. Even if channel regions have the same impurity distribution, the threshold voltages of the MOS transistors vary with the channel lengths L. Therefore, MOS transistors having different threshold voltages can be formed by simply changing the channel lengths L. Thus, MOS transistors having large absolute values of threshold voltages can be formed without increasing the number of fabrication steps, to be utilized for the latch stage of the slave latch circuit 24.

Modification

As shown in parentheses in the slave latch circuit 24 in FIG. 17, the channel widths W of the MOS transistors PQ10, PQ11, NQ10 and NQ11 are rendered narrower than those of the remaining MOS transistors, to cause a so-called "narrow channel effect". This narrow channel effect is an effect of increasing transverse spreading of a depletion layer formed in a channel region and increasing fixed charges therein, thereby increasing the absolute value of the threshold voltage. Also in the structure of reducing the channel widths W, impurity concentration profiles of channel regions are similar to those of the remaining MOS transistors PQ, NQ and NG, and MOS transistors having large absolute values of threshold voltages can be formed without increasing the number of fabrication steps.

MOS transistors PQ10, PQ11, NQ10 and NQ11 may be increased in channel length L and reduced in channel width W. In this case, a transmission coefficient β (constant proportionate to W/L) reduces, current drivability reduces and the voltage levels of the internal output nodes OD3 and OD4 can be determined (latch polarity can be determined) in response to the difference between conductances of MOS transistors NG3 and NG4.

Structure/Arrangement of Power Supply Transistor PQ7

Figure 18:
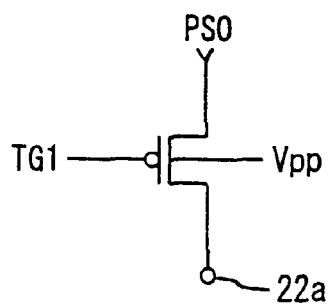
FIG. 18 illustrates an exemplary structure of a power supply transistor shown in FIG. 17.

In the master latch circuit 22, the absolute value of the threshold voltage of the power supply transistor PQ7 must be increased for reducing a leakage current. In this case, a high voltage Vpp is supplied to a back gate of the power supply transistor PQ7 as shown in FIG. 18, for deepening a substrate bias to increase the absolute value of the threshold voltage. The power supply transistor PQ7 may be adjusted in channel length L and/or channel width W, similarly to the MOS transistors PQ10 and PQ11.

Arrangement of Power Supply Transistor

Figure 19:
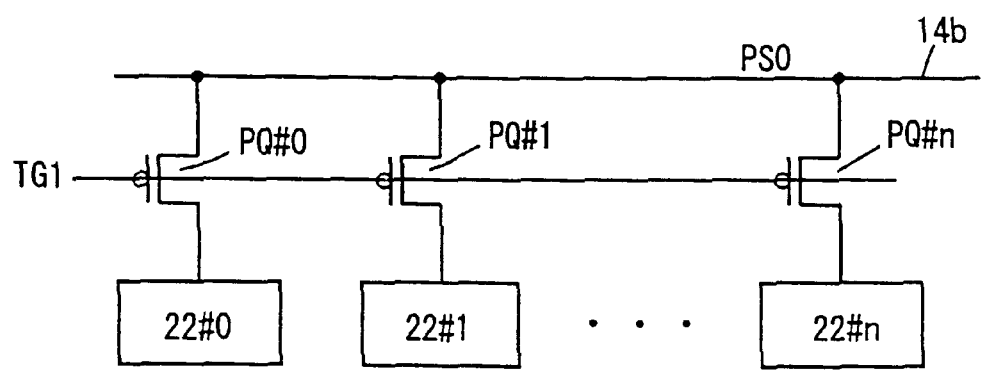
FIG. 19 illustrates arrangement of power supply transistors of flip-flops according to the present invention.

FIG. 19 illustrates an arrangement of power supply transistors for master latch circuits. Referring to FIG. 19, power supply transistors PQ#0 to PQ#n are provided in correspondence to master latch circuits 22#0 to 22#n respectively. Each of the power supply transistors PQ#0 to PQ#n transmits a control power supply voltage PS0 on a control voltage transmission line 14b to the corresponding one of the master latch circuits 22#0 to 22#n. In the arrangement shown in FIG. 19, the control power supply voltage PS0 on the control voltage transmission line 14b is substantially at a constant level (interconnection line resistance of the control voltage transmission line 14b is sufficiently small). Therefore, control power supply voltages of the same level can be transmitted to the master latch circuits 22#0 to 22#n through the corresponding power supply transistors PQ#0 to PQ#n in a normal mode for ensuring stable operation.

Arrangement 2 of Power Supply Transistor

Figure 20:
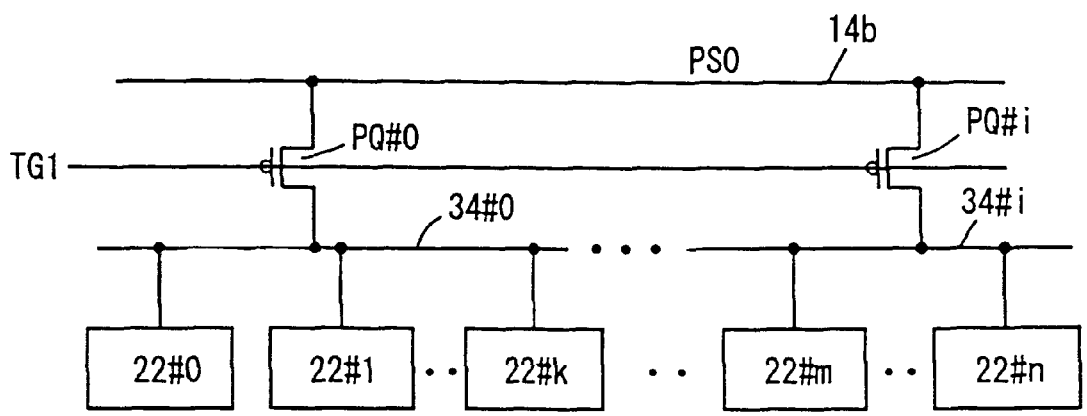
FIG. 20 illustrates another exemplary arrangement of the power supply transistors according to the present invention.

FIG. 20 illustrates an arrangement 2 of power supply transistors for master latch circuits. In the arrangement shown in FIG. 20, master latch circuits 22#0 to 22#n are grouped into a plurality of groups. Referring to FIG. 20, master latch circuits 22#0 to 22#k form a group, and master latch circuits 22#m to 22#n form another group. Sub power supply lines 34#0 to 34#i are provided in correspondence to the groups of the master latch circuits. Power supply transistors PQ#0 to PQ#i are provided in correspondence to the sub power supply lines 34#0 to 34#i, respectively, for transmitting a control power supply voltage PS0 from a control voltage transmission line 14b to the sub power supply lines 34#0 to 34#i respectively.

In the arrangement shown in FIG. 20, the number of the power supply transistors can be reduced. Further, paths feeding currents can be split by grouping the power supply transistors PQ#0 to PQ#i, thereby preventing localized concentration of the currents.

Each of FIGS. 19 and 20 shows arrangement of the power supply transistors for the master latch circuits 22. When current source transistors are provided for slave latch circuits, arrangement similar to that shown in FIG. 19 or 20 is employed.

In each of the embodiments 1 to 5 described above, the master latch circuit and the slave latch circuit may be suitably combined with each other.

According to the embodiment 6 of the present invention, as hereinabove described, the channel lengths (widths) of the latch MOS transistors of the slave latch circuit are increased beyond (decreased below) those of the remaining MOS transistors, whereby MOS transistors having different threshold voltages can be formed without increasing the number of fabrication steps.

Embodiment 7

Figure 21:
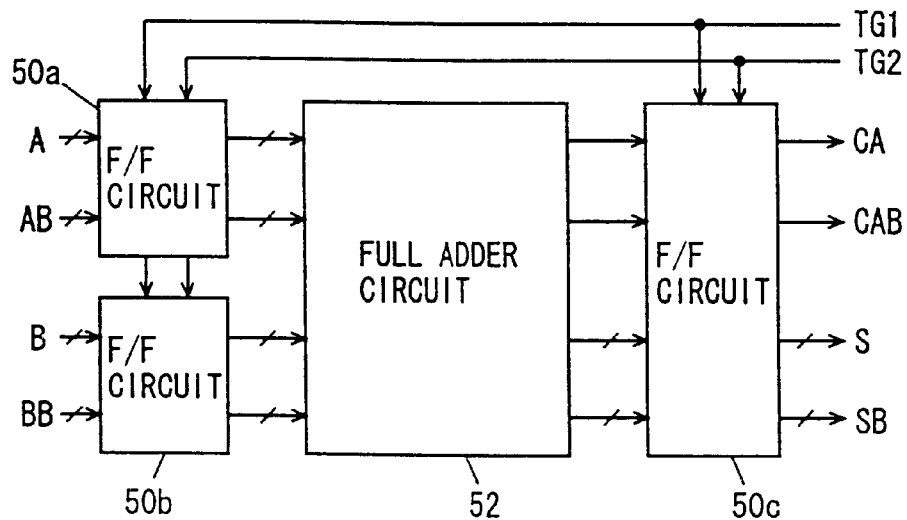
FIG. 21 schematically illustrates the overall structure of a semiconductor circuit device according to an embodiment 7 of the present invention.

FIG. 21 schematically illustrates the structure of a semiconductor circuit device according to an embodiment 7 of the present invention. Referring to FIG. 21, the semiconductor circuit device includes a flip-flop (F/F) circuit 50a transmitting complementary multi-bit binary data A and AB in synchronization with two-phase transfer clock signals TG1 and TG2, a flip-flop (F/F) circuit 50b transferring complementary multi-bit binary data B and BB in synchronization with the transfer clock signals TG1 and TG2, a full adder circuit 52 adding up the data supplied from the flip-flop circuits 50a and 50b, and a flip-flop (F/F) circuit 50c outputting sum output data S and BB and carry signals CA and CAB from the full adder circuit 52 in synchronization with the transfer clock signals TG1 and TG2. The respective bits of the binary data A and AB are complementary to each other, and the binary number AB is the one's complement of the binary number A. Similarly, the binary number BB is the one's complement of the binary number B. The carry signals CA and CAB are complementary to each other. The sum output data BB is the one's complement of the sum output data S. This is because the full adder circuit 52 outputs signals of complementary logical levels for respective bits of the addition result data, as described later in detail.

Figure 22:
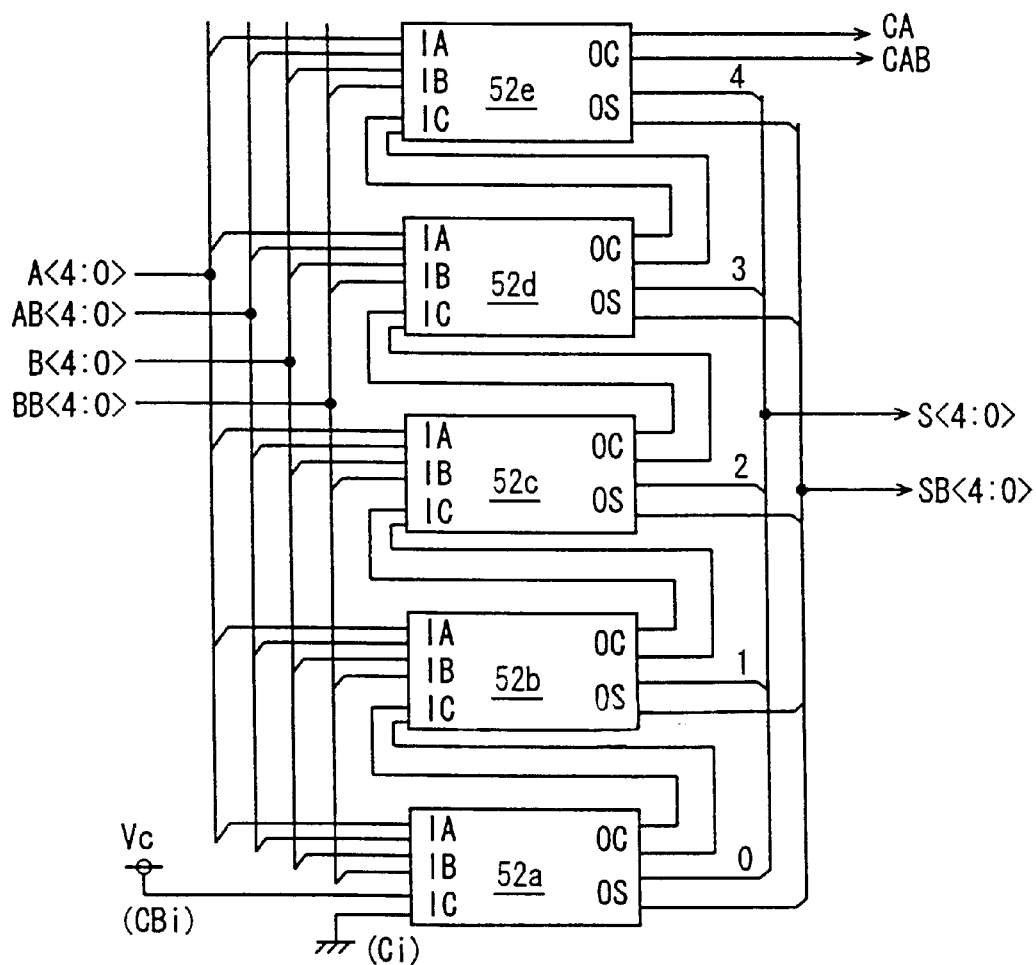
FIG. 22 illustrates an exemplary structure of a full adder circuit shown in FIG. 21.

FIG. 22 illustrates an exemplary structure of the full adder circuit 52 shown in FIG. 21, and shows a structure of adding 5-bit binary data A<4:0> and B<4:0> as the full adder circuit 52. Referring to FIG. 22, the full adder circuit 52 includes full adders 52a to 52e having the same structure. Each of the full adders 52a to 52e includes inputs IA and IB receiving complementary data bits, a carry input IC inputting complementary carry signals from a lower-stage full adder, a carry output OC outputting complementary carry signals, and a sum output OS outputting complementary data bits indicating addition results.

Each of the full adders 52a to 52e is supplied with corresponding bits of the binary data A<4:0> and AB<4:0> and corresponding bits of the binary data B<4:0> and BB<4:0>. For example, the full adder 52a is supplied with the least significant bits A<0>, AB<0>, B<0> and BB<0>. The carry input IC of the full adder 52a provided for the least significant bits is supplied with a power supply voltage Vc and a ground voltage. A carry supplied to the full adder 52a is "0", and the ground voltage is supplied to a true carry input while the power supply voltage Vc is supplied to a complementary carry input. The power supply voltage Vc is supplied from a power source different from that for a power supply voltage supplied to the flip-flop circuits. The full adders 52a to 52e output 5-bit addition result data S<4:0> and SB<4:0> and complementary carry signals CA and CAB.

Figure 23:
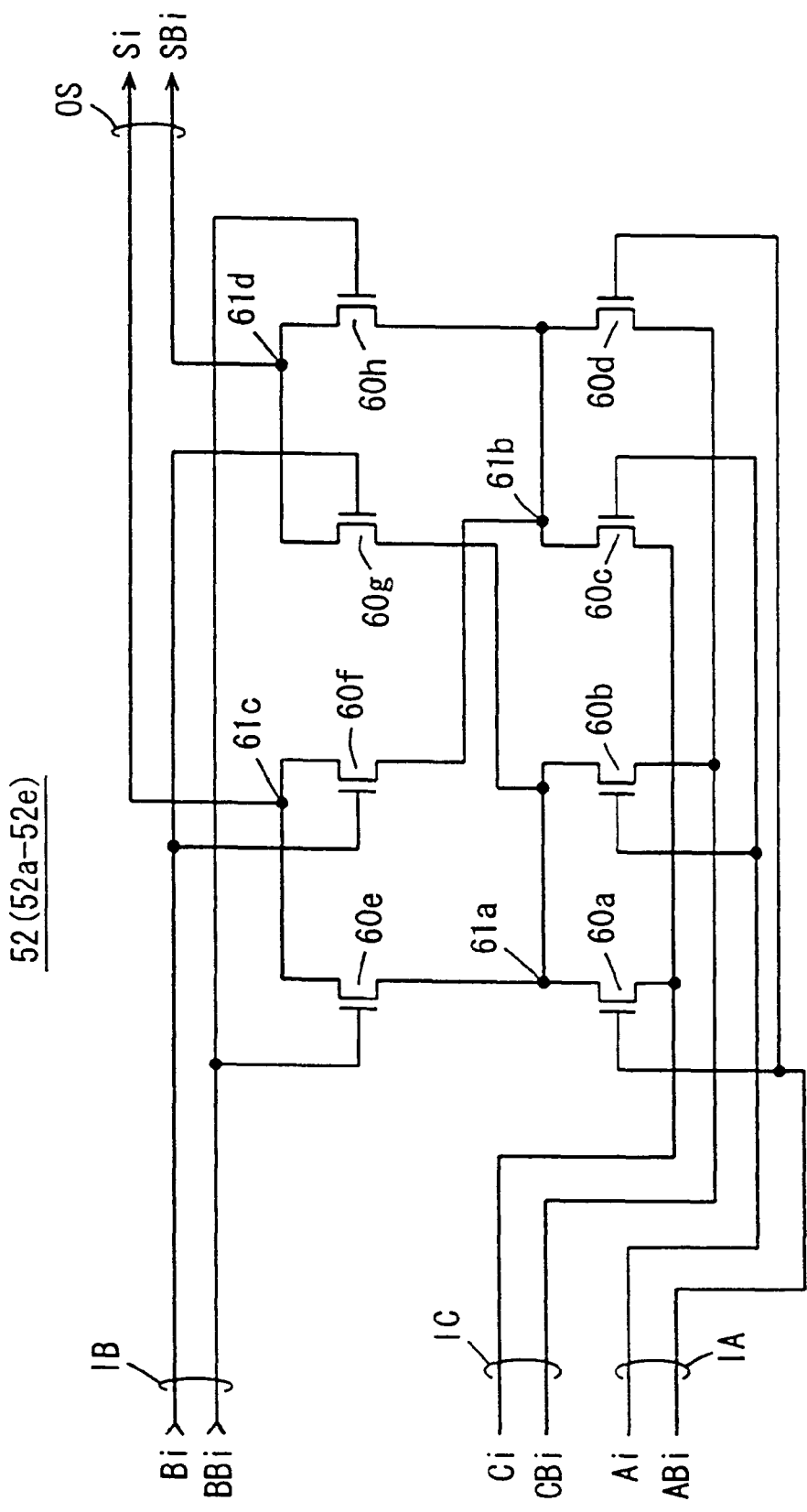
FIG. 23 illustrates the structure of the full adder shown in FIG. 22.

FIG. 23 illustrates the structure of each of the full adders 52a to 52e, which are identical in structure to each other. The full adder has a part for generating sum outputs and a part for generating carry outputs, and FIG. 23 shows the structure of the part generating sum output signals Si and SBi of the full adder.

Referring to FIG. 23, the full adder (52a to 52e) includes an n-channel MOS transistor 60a transmitting an input carry signal Ci to a node 61a in response to an input signal ABi, an n-channel MOS transistor 60b transmitting a complementary input carry signal CBi to the node 61a in response to an input signal Ai, an n-channel MOS transistor 60c transmitting the input carry signal Ci to a node 61b in response to the input signal Ai, and an n-channel MOS transistor 60d transmitting the complementary input carry signal CBi to the node 61b in response to the input signal ABi. The input signals Ai and ABi are complementary signals supplied to an input IA, and correspond to binary data bits A<i> and AB<i>. The carry signals Ci and CBi are supplied from the lower-stage full adder. In the least significant bit full adder 52a, the carry signal Ci is fixed at the ground voltage level, while the complementary carry signal CBi is fixed at the level of the power supply voltage Vc (in a normal mode).

The full adder (52a to 52e) further includes an n-channel MOS transistor 60e transmitting the signal on the node 61a to a node 61c in response to an input signal BBi, an n-channel MOS transistor 60f transmitting the signal on the node 61b to the node 61c in response to an input signal Bi, an n-channel MOS transistor 60g transmitting the signal on the node 61a onto a node 61d in response to the input signal Bi, and an n-channel MOS transistor 60h transmitting the signal on the node 61b to the node 61d in response to the input signal BBi. The node 61c outputs a sum output signal Si, and the node 61d outputs a complementary sum output signal SBi.

The input signals Bi and BBi correspond to binary data bits B<i> and BB<i> supplied to an input IB. The sum output signals Si and SBi outputted from a sum output OS correspond to sum output data bits S<i> and SB<i>. Operations of the addition result output shown in FIG. 23 are now described.

(1) Bi=0 (Low Level):
When the signal Bi is "0" (low level), the signal BBi is at a high level, MOS transistors 60e and 60h are rendered conductive, the node 61a is connected to the node 61c, and the node 61b is connected to the node 61d.

(i) When the signal Ai is "1", MOS transistors 60b and 60c are rendered conductive, the input carry signal CBi is transmitted to the node 61a, and the input carry signal Ci is transmitted to the node 61b. Therefore, the sum output signal Si is generated in accordance with the input carry signal CBi, and the complementary sum result signal SBi is generated through the input carry signal Ci. Thus, the sum output signal Si is "0" when the input carry signal Ci is "1", while the sum result signal Si is "1" when the input carry signal Ci is "0".

In other words, Si=1+Ci+0 is executed, where "+" indicates addition of a module 2.

(ii) Input Signal Ai="0":
In this state, MOS transistors 60a and 60d are rendered conductive, the input carry signal Ci is transmitted to the node 61a, and the complementary input carry signal CBi is transmitted to the node 61b. Therefore, the sum result signal Si is generated through the input carry signal Ci and the sum result signal SBi is generated in accordance with the complementary carry input signal CBi.

Therefore, Si=0+0+Ci is implemented in this state.

(2) Bi=1:
In this state, MOS transistors 60f and 60g are rendered conductive, the node 60a is coupled to the node 61d, and the node 61b is connected to the node 61c. Thus, the nodes 61c and 61d and the nodes 61a and 61b are connected in a manner reverse to that when the input signal Bi is "0". Thus, the sum result signal Si is generated in accordance with the input carry signal Ci when the input signal Ai is "1", while the sum result signal Si is generated in accordance with the complementary input carry signal CBi when the input signal Ai is "0". Thus, Si=1+Ai+Si is implemented.

From the expressions for the input signal Bi, the structure shown in FIG. 23 implements the following expressions:

Si=Ai+Bi+Ci

SBi=ABi+BBi +CBi

In other words, the carry inputs from the front-stage full adder are added with tie input signal bits Ai and Bi, to generate the signal Si indicating the addition result.

As shown in FIG. 23, the part generating the sum result signals in the full adder consumes no current from a power supply node except for the carry input signal Ci for the least significant bit full adder, and merely transmits the input signals, and can implement low current consumption. Even if the signals are transmitted through pass transistors and reduced in amplitude, the small amplitude signals can be reliably amplified and latched in the back-stage flip-flop circuit, as described with reference to the embodiments 1 to 6.

Figure 24:
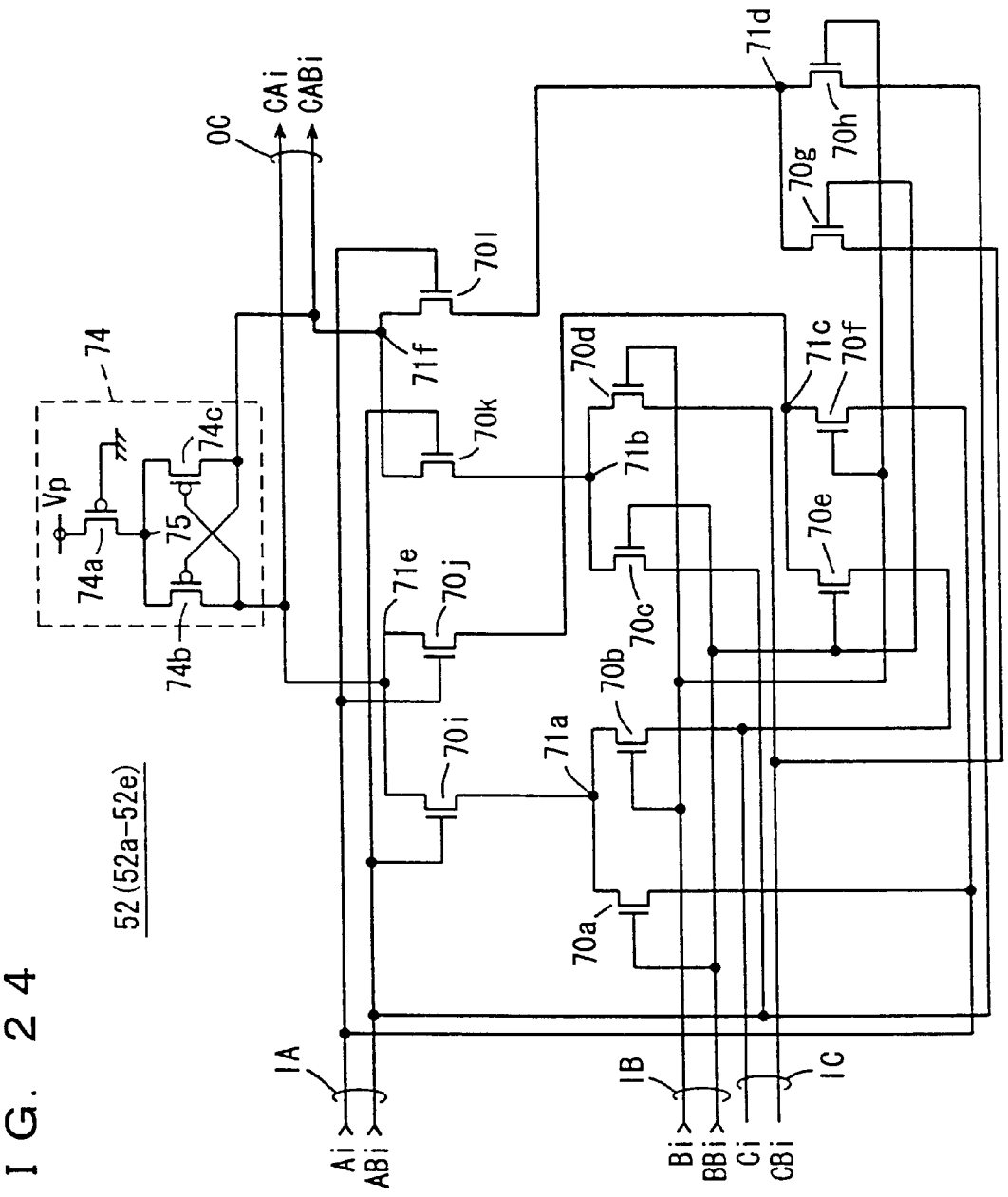
FIG. 24 illustrates the structure of the full adder circuit shown in FIG. 22.

FIG. 24 illustrates the structure of the part generating the carry signals in each of the full adders 52a to 52e. Carry signals Ci and CBi are supplied to the carry input IC of the upper-stage full adder. The carry signals Ci and CBi from the most significant bit full adder 52e are supplied to the back-stage flip-flop (F/F) circuit (see FIG. 21).

Referring to FIG. 24, each of the full adders 52a to 52e includes an n-channel MOS transistor 70a transmitting the input signal Ai to a node 71a in response to the input signal BBi, an n-channel MOS transistor 70b transmitting the input carry signal Ci to the node 71a in response to the input signal Bi, an n-channel MOS transistor 70c transmitting the input signal ABi to a node 71b in response to the input signal BBi, an n-channel MOS transistor 70d transmitting the input carry signal CBi to the node 71b in response to the input signal Bi, an n-channel MOS transistor 70e transmitting the input carry signal Ci to a node 71c in response to the input signal BBi, an n-channel MOS transistor 70f transmitting the input signal Ai onto the node 71c in response to the input signal Bi, an n-channel MOS transistor 70g transmitting the input carry signal CBi to a node 71d in response to the input signal BBi, and an n-channel MOS transistor 70h transmitting the input signal ABi onto the node 71d in response to the input signal Bi.

The input signals Ai, ABi, Bi and BBi and the input carry signals Ci and CBi are identical to those shown in FIG. 23.

The full adder (52a to 52e) further includes an n-channel MOS transistor 70i transmitting the signal on the node 71a onto a node 71e in response to the input signal ABi, an n-channel MOS transistor 70j transmitting the signal on the node 71c onto the node 71e in response to the input signal Ai, an n-channel MOS transistor 70k transmitting the signal on the node 71b onto a node 71f in response to the input signal ABi, and an n-channel MOS transistor 70l transmitting the signal on the node 71b onto the node 71f in response to the input signal Ai. Carry signal Cai is generated at node 71e, the complementary carry signal CABi is generated at node 71f.

The full adder further includes a pull-up circuit 74 for pulling up the signal on the node 71f or 71e. The pull-up circuit 74 includes a p-channel MOS transistor 74a having a gate coupled to the ground voltage for transmitting a peripheral power supply voltage Vp to a node 75, a p-channel MOS transistor 74b connected between the nodes 75 and 71e with a gate thereof connected to the node 71f, and a p-channel MOS transistor 74c connected between the nodes 75 and 71f with a gate thereof connected to the node 71e.

This pull-up circuit 74 drives a node at a higher potential of the nodes 71e and 71f to the level of the peripheral power supply voltage Vp for latching through the cross-connected p-channel MOS transistors 74b and 74c. The pull-up circuit 74 is utilized to set the amplitudes of carry signals CAi and CABi at the level of the peripheral power supply voltage Vp, thereby preventing reduction of the amplitudes of the carry signals transmitted through the plurality of stages (five stages) of full adders. The voltage Vp may be supplied from the same power source as the voltage Vc, or from a different power source. Operations of the full adder shown in FIG. 24 are now described.

(1) Bi=0:

When the input signal Bi is "0", MOS transistors 70a and 70c are rendered conductive while MOS transistors 70b and 70d are rendered non-conductive. Therefore, the input signal Ai is transmitted to the node 71a, and the input signal ABi is transmitted to the node 71b.

Further, MOS transistors 70e and 70g are rendered conductive while MOS transistors 70f and 70h are rendered non-conductive. Therefore, the input cards signal Ci is transmitted to the node 71c, and the input carry signal CBi is transmitted to the node 71d.

(i) When the input signal Ai is "0", MOS transistors 70i and 70k are rendered conductive while MOS transistors 70j and 70l are rendered non-conductive. Therefore, the signal Ai on the node 71a is transmitted to the node 71e, while the signal CBi on the node 70d is transmitted to the node 71f. The carry signal CAi is determined in response to the signal Ai, and becomes zero. In other words, the carry signal CAi is "0" when Bi=Ai=0, regardless of the value of the input carry signal Ci.

(ii) Ai=1:

In this state, MOS transistors 70j and 70l are rendered conductive while MOS transistors 70i and 70k are rendered non-conductive. The carry signal Ci on the node 71c is transmitted onto the node 71e, and the signal CBi on the node 71d is transmitted to the node 71f. In other words, the carry signal CAi is determined in response to the input carry signal Ci, and the complementary carry signal CABi is determined in response to the input carry signal CBi in this state. Specifically, a carry occurs when both the input carry signal Ci and the input signal Ai are "1" so that the carry signal CAi is "1", while no carry occurs when the input signal Ai is "1" and the input carry signal Ci is "0" so that the carry signal CAi is "0".

(2) Bi=1:

In this state, MOS transistors 70b and 70d are rendered conductive while MOS transistors 70a and 70c are rendered non-conductive. Further, MOS transistors 70f and 70h are rendered conductive while MOS transistors 70e and 70g are rendered non-conductive. Therefore, the carry signal Ci is transmitted to the node 71a and the complementary input carry signal CBi is transmitted to the node 71b. Further, the signal Ai is transmitted to the node 71c, and the signal ABi is transmitted to the node 71d.

(i) When the input signal Ai is "1", the input signal Ai on the node 71c is transmitted to the node 71e while the signal ABi on the node 71d is transmitted to the node 71f. Therefore, the carry signal CAi is determined in response to the input signal Ai. In other words, the carry signal CAi is "1". Specifically, a carry occurs when Bi=Ai=1 regardless of the value of the input carry signal Ci, so that the carry signal CAi is "1".

(ii) When the input signal Ai is "0", the input carry signal Ci is transmitted to the node 71e and the complementary input carry signal CBi on the node 71b is transmitted to the node 71f. Therefore, the carry signal CAi is determined in response to the input carry signal Ci. In other words, the logical level of the carry signal CAi is determined by the logical value of the input carry signal Ci when only one of the input signals Bi and Ai is "1".

When both the input signals Ai and Bi are "1" or "0", the carry signal CAi is "1" or "0" regardless of the value of the input carry signal Ci. When only one of the input signals Ai and Bi is "1", the carry signal CAi is determined by the logical value of the input carry signal Ci. Thus, the carry signals CAi and CABi can be generated in accordance with the input signals Ai and Bi and the input carry signal Ci.

The carry signal CAi is sequentially transmitted through the full adders 52a to 52e shown in FIG. 22. However, the amplitudes of the carry signals CAi and CABi can be sufficiently increased by employing the pull-up circuit 74. Even if the carry signals are transmitted through a number of pass transistors, the signal amplitude reduction can be prevented and the carry signals can be transmitted at a high speed. If reduction of the amplitudes of the carry signals is relatively small and the back-stage flip-flop circuit F/F can sufficiently detect the levels and amplify and latch the carry signals, the pull-up circuit 74 may be omitted. In this case, current consumption can be reduced.

In the full adder shown in FIGS. 23 and 24, all MOS transistors are formed by low-Vth transistors and can operate at a high speed.

Structure of Flip-Flop

Figure 25:
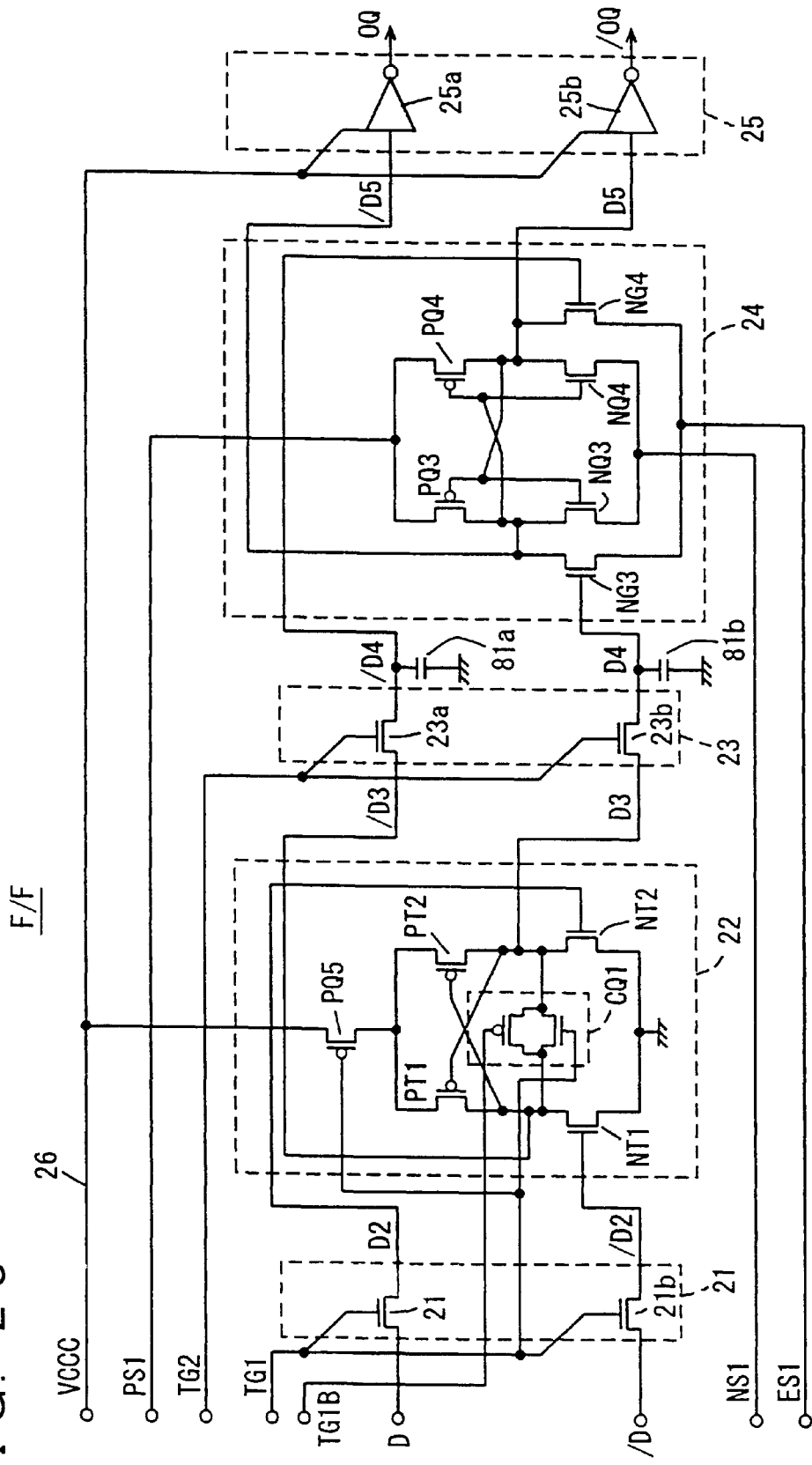
FIG. 25 illustrates the structure of a flip-flop circuit shown in FIG. 22.
Figure 26:
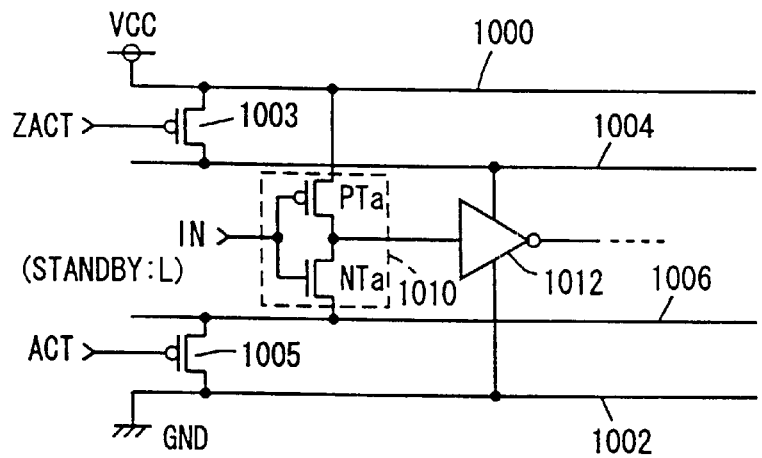
FIG. 26 illustrates a conventional hierarchical power supply structure.
Figure 27:
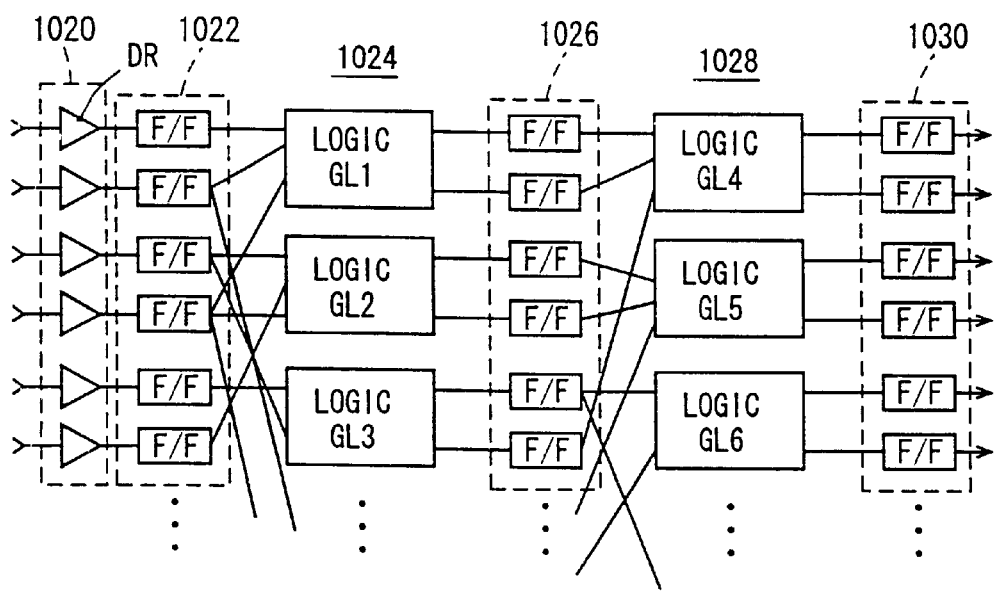
FIG. 27 schematically illustrates the structure of a conventional semiconductor circuit device.
Figure 28:
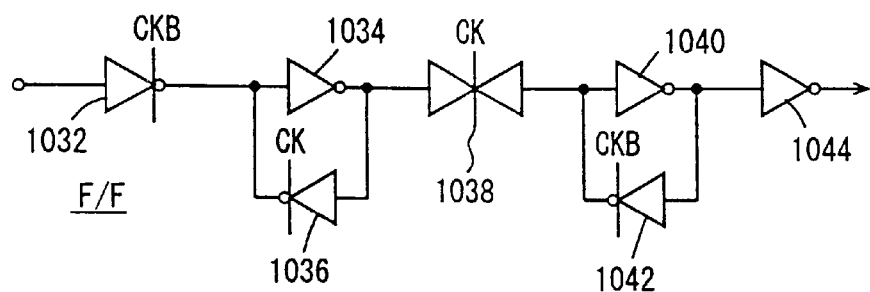
FIG. 28 schematically illustrates the structure of a flip-flop shown in FIG. 27.

FIG. 25 illustrates the structure of each of the flip-flop circuits 50a to 50c shown in FIG. 21, and representatively shows a flip-flop F/F provided for a pair of complementary signals. The structure of the flip-flop F/F shown in FIG. 25 is substantially identical to that shown in FIG. 12, and corresponding parts are denoted by the same reference numerals to omit description thereof In the flip-flop F/F shown in FIG. 25, stabilizing capacitances 81a and 81b are provided on output parts of the transfer circuit 23, respectively. MOS transistors PQ3 and PQ4 receive a control power supply voltage PS1 at sources thereof.

The stabilizing capacitances 81a and 81b prevent gates of MOS transistors NG3 and NG4 from electrically floating for preventing gate voltages of the MOS transistors NG3 and NG4 from fluctuating to exert adverse influence on latch states of the MOS transistors PQ3, PQ4, NQ3 and NQ4 when the transfer circuit 23 is rendered non-conductive.

In the flip-flop F/F shown in FIG. 25, MOS transistors PQ3, PQ4, PQ5, NQ3 and NQ5 are low leakage current MOS transistors having large absolute values of threshold voltages. Remaining MOS transistors are low-Vth transistors, the small amplitude signals D and /D can be latched and transferred at a high speed in accordance with the transfer clock signals TG1 and TG2.

The logic circuit formed by this pass transistor logic element is not restricted to the full adder as described above.

As shown in FIG. 9, the sources of MOS transistors PQ3 and PQ4 may receive the control power supply voltage PSI through a current source transistor (PQ6). Further, an equalize transistor (NT3) for equalizing the data signals D5 and /D5 may be provided. The slave latch circuit 24 may be selectively formed as a dynamic or static latch circuit by mask interconnection.

According to the present invention, as hereinabove described, the logic circuit is formed by the pass transistors and the output signals of the pass transistor logic elements are supplied to the gates of the MOS transistors, whereby logical processing can be performed employing low-Vth transistors and high-speed arithmetic processing can be performed with low current consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a storage circuit receiving first and second power source voltages from first and second power source nodes, respectively, for storing a binary signal applied to an input node; and
   a transistor element having a first conduction node coupled to said input node, a control gate receiving a signal from another circuit, and a second conduction node coupled to receive a third power source voltage from a third power source node;
   a potential difference between the first and second power source nodes in a first operation mode being smaller than in a second operation mode different from the first operation mode.

2. The semiconductor device according to claim 1, wherein said storage circuit comprises cross-coupled field effect transistors having drains and control gates cross-coupled with each other.

3. The semiconductor device according to claim 1, wherein the third power source voltage is set to a level intermediate between the first and second power source voltages in said first operation mode.

4. The semiconductor device according to claim 1, wherein said storage circuit further comprises an output node coupled to said another circuit through a high impedance.

5. The semiconductor device according to claim 1, further comprising
   an output driver receiving the binary signal at a high impedance input and generating an output signal corresponding to the received binary signal when activated.

6. A semiconductor device comprising:
   a storage circuit receiving first and second power source voltages from first and second power source nodes, respectively, for storing a binary signal applied to an input node; and
   a transistor element having a first conduction node coupled to said input node, a control gate receiving a signal from another circuit and a second conduction node coupled to receive a third power source voltage from a third power source node;
   a potential difference between the second and third power source nodes in a first operation mode being larger than in a second operation mode different from the first operation mode.

7. The semiconductor device according to claim 6, wherein
   a voltage difference of said third power source voltage between said first operation mode and said second operation mode is greater than a voltage difference of said second power source voltage between said first operation mode and said second operation mode.

8. The semiconductor device according to claim 6, wherein said storage circuit further comprises an output node coupled to said another circuit through a high impedance.

9. The semiconductor device according to claim 6, further comprising
   an output driver receiving the binary signal at a high impedance input and generating an output signal corresponding to the received binary signal when activated.

* * * * *